(12) United States Patent
Iida et al.

(10) Patent No.: US 10,153,296 B2
(45) Date of Patent: Dec. 11, 2018

(54) MEMORY DEVICE AND METHOD FOR MANUFACTURING SAME

(71) Applicant: Toshiba Memory Corporation, Minato-ku (JP)

(72) Inventors: Naoyuki Iida, Yokkaichi (JP); Hideki Inokuma, Yokkaichi (JP); Naoki Yamamoto, Kuwana (JP); Yoshihiro Yanai, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 10 days.

(21) Appl. No.: 15/649,784

(22) Filed: Jul. 14, 2017

(65) Prior Publication Data

US 2018/0247955 A1 Aug. 30, 2018

Related U.S. Application Data

(60) Provisional application No. 62/463,313, filed on Feb. 24, 2017.

(51) Int. Cl.

| | |
|---|---|
| *H01L 21/28* | (2006.01) |
| *H01L 27/11582* | (2017.01) |
| *H01L 23/528* | (2006.01) |
| *H01L 21/311* | (2006.01) |
| *H01L 27/11565* | (2017.01) |

(Continued)

(52) U.S. Cl.
CPC .. *H01L 27/11582* (2013.01); *H01L 21/28282* (2013.01); *H01L 21/31144* (2013.01); *H01L 23/528* (2013.01); *H01L 27/11524* (2013.01); *H01L 27/11565* (2013.01); *H01L 27/11575* (2013.01)

(58) Field of Classification Search
CPC ............... H01L 27/11524; H01L 27/11575
USPC .......................................................... 257/324
See application file for complete search history.

(56) References Cited

U.S. PATENT DOCUMENTS

2007/0252201 A1  11/2007  Kito et al.
2010/0323505 A1  12/2010  Ishikawa et al.
(Continued)

FOREIGN PATENT DOCUMENTS

| JP | 2007-088145 | 4/2007 |
| JP | 2007-266143 | 10/2007 |
| JP | 2011-003722 | 1/2011 |

*Primary Examiner* — David Vu
*Assistant Examiner* — Brandon Fox
(74) *Attorney, Agent, or Firm* — Oblon, McClelland, Maier & Neustadt, L.L.P.

(57) ABSTRACT

A memory device includes a substrate and a stacked body arranged along a first direction. The stacked body includes electrode films. A configuration of an end portion in a second direction of the stacked body is a staircase configuration. Steps corresponding to the electrode films are formed in the staircase configuration. A first distance between a first step and an end edge of the stacked body in the second direction is shorter than a second distance between a second step and the end edge in the second direction. The first step is positioned at an end portion in a third direction of the stacked body. The second step is positioned at a central portion in the third direction of the stacked body. The first and second steps correspond to two of the electrode films positioned at the same level when counting along the first direction from the substrate side.

20 Claims, 36 Drawing Sheets

(51) Int. Cl.
*H01L 27/11575* (2017.01)
*H01L 27/11524* (2017.01)

(56) References Cited

U.S. PATENT DOCUMENTS

| | | | | |
|---|---|---|---|---|
| 2016/0064281 A1* | 3/2016 | Izumi | ................ | H01L 21/76816 |
| | | | | 257/315 |
| 2016/0322374 A1* | 11/2016 | Sano | ................ | H01L 21/31111 |
| 2017/0213840 A1* | 7/2017 | Sudo | ................ | H01L 21/28282 |
| 2017/0263558 A1* | 9/2017 | Shingu | ................ | H01L 23/5283 |
| 2017/0263613 A1* | 9/2017 | Murakoshi | .......... | H01L 27/1157 |
| 2017/0323798 A1* | 11/2017 | Kang | ................ | H01L 27/1157 |

* cited by examiner

MEMORY DEVICE AND METHOD FOR MANUFACTURING SAME

CROSS-REFERENCE TO RELATED APPLICATIONS

This application is based upon and claims the benefit of priority from U.S. Provisional Patent Application 62/463,313, filed on Feb. 24, 2017; the entire contents of which are incorporated herein by reference.

FIELD

Embodiments relate to a memory device and a method for manufacturing the same.

BACKGROUND

In recent years, a stacked type semiconductor memory device has been proposed in which memory cells are integrated three-dimensionally. In such a stacked type semiconductor memory device, a stacked body in which electrode films and insulating films are stacked alternately is provided on a semiconductor substrate; and semiconductor pillars that pierce the stacked body are provided. Also, memory cells are formed at each crossing portion between the electrode films and the semiconductor pillars. The end portion of the stacked body is patterned into a staircase configuration; and a contact is connected to each of the electrode films. It is a challenge to increase the shape precision to downscale such a semiconductor memory device even further.

DETAILED DESCRIPTION

A memory device according to an embodiment includes a substrate and a stacked body. The substrate and the stacked body are arranged along a first direction. The stacked body includes a plurality of electrode films. A configuration of an end portion in a second direction of the stacked body is a staircase configuration. The second direction is parallel to a major surface of the substrate. A plurality of steps corresponding to the plurality of electrode films are formed in the staircase configuration. A first distance between a first step arid an end edge of the stacked body in the second direction is shorter than a second distance between a second step and the end edge in the second direction. The first step is a step of the plurality of steps positioned at an end portion in a third direction of the stacked body. The second step is a step of the plurality of steps positioned at a central portion in the third direction of the stacked body. The first step and the second step correspond to two electrode films of the plurality of electrode films positioned at the same level when counting along the first direction from the substrate side. The third direction crosses the second direction and is parallel to the major surface.

First Embodiment

First, a first embodiment will be described.

Figure 1:
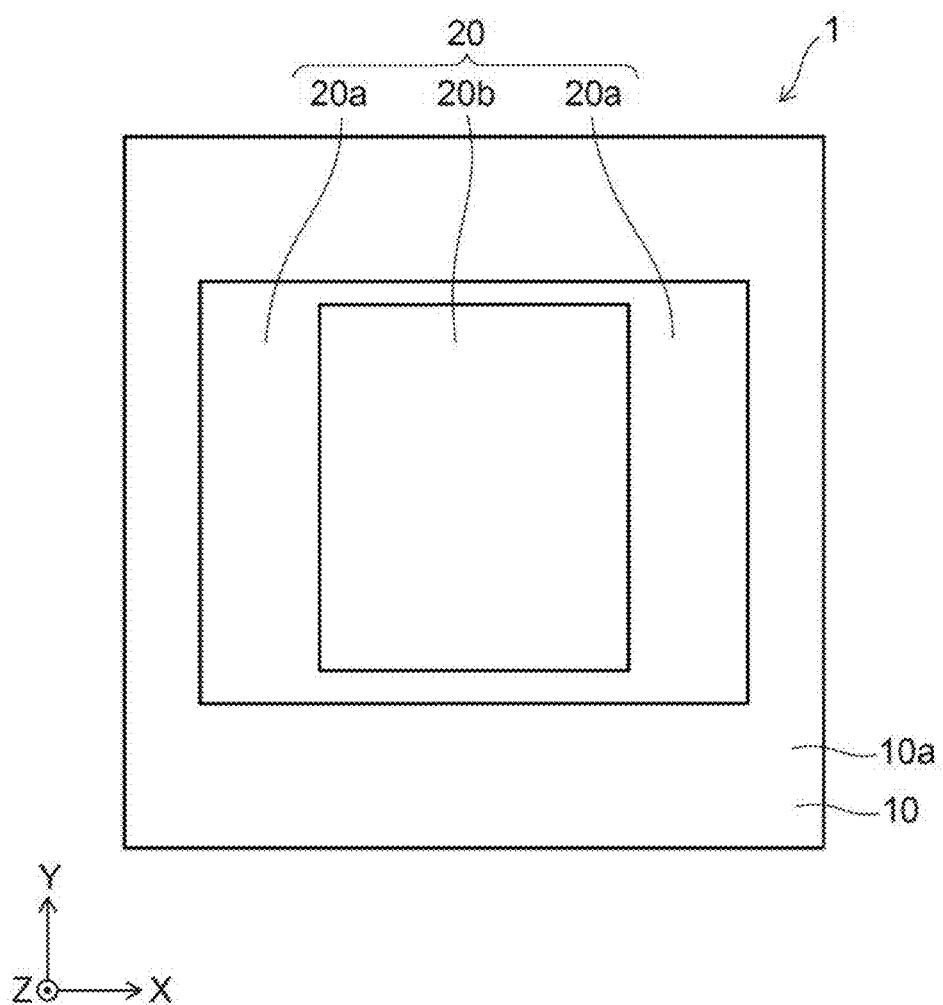
FIG. 1 is a plan view showing a memory device according to a first embodiment.

FIG. 1 is a plan view showing a memory device according to the embodiment.

Figure 2A:
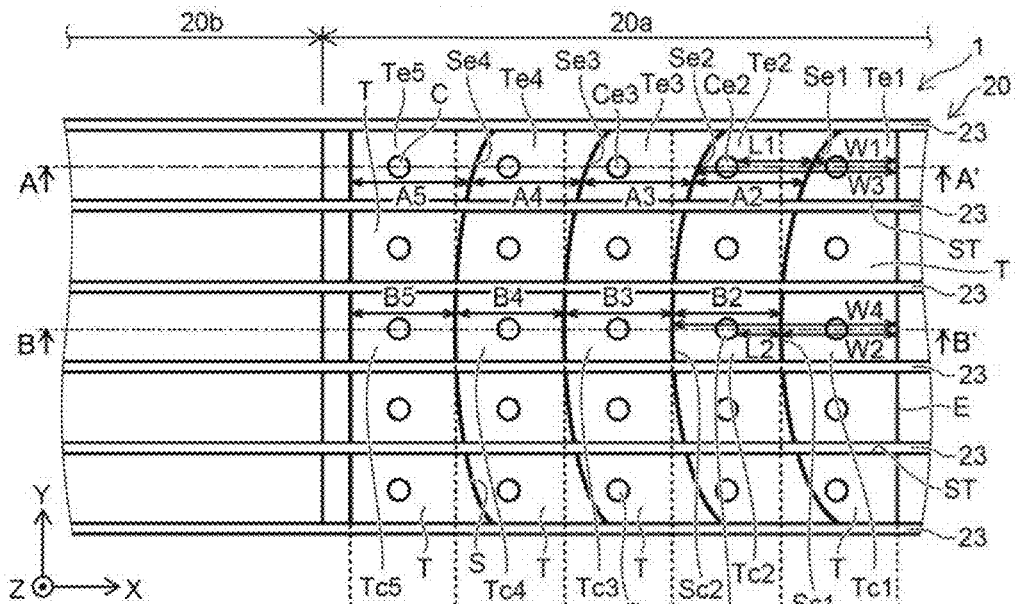
FIG. 2A is a plan view showing a portion of the memory device according to the first embodiment.
Figure 2B:
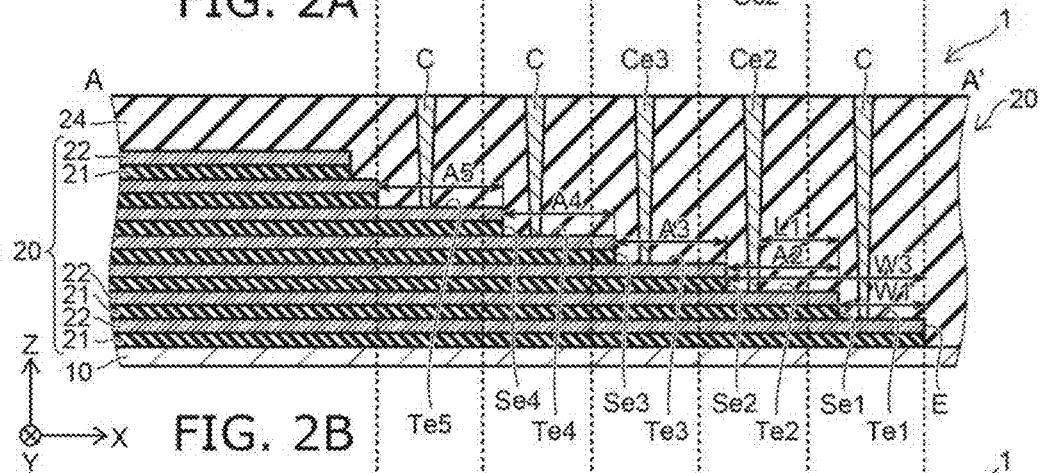
FIG. 2B is a cross-sectional view along line A-A' shown in FIG. 2A.
Figure 2C:
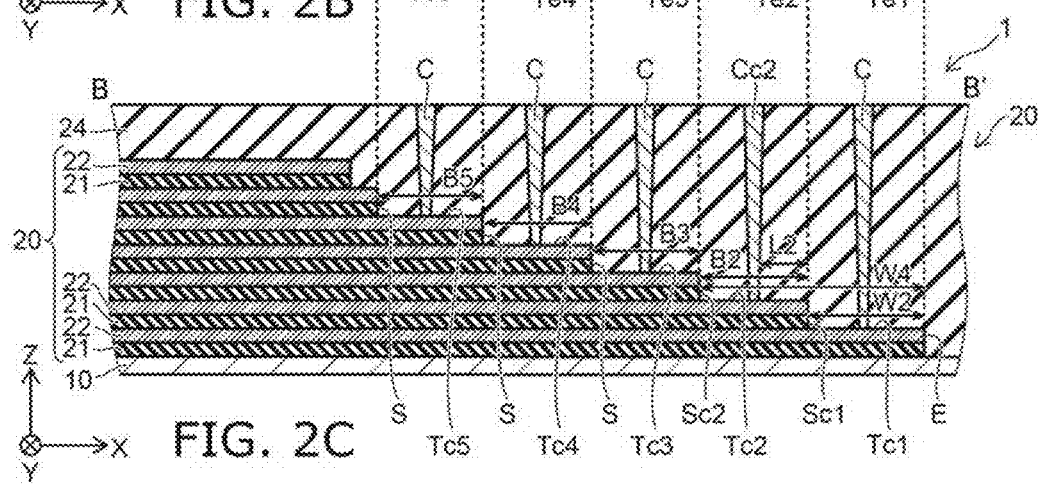
FIG. 2C is a cross-sectional view along line B-B' shown in FIG. 2A.

FIG. 2A is a plan view showing a portion of the memory device according to the embodiment; FIG. 2B is a cross-sectional view along line A-A' shown in FIG. 2A; and FIG. 2C is a cross-sectional view along line B-B' shown in FIG. 2A.

The drawings are schematic and are drawn with appropriate exaggerations or omissions. For example, the components are drawn to be larger and fewer than the actual components. Also, the numbers, dimensional ratios, etc., of the components do not always match between the drawings. This is similar for the other drawings described below as well.

The memory device according to the embodiment is a stacked nonvolatile semiconductor memory device and is, for example, stacked type NAND flash memory.

As shown in FIG. 1, a silicon substrate 10 is provided in the memory device 1 according to the embodiment. A stacked body 20 is provided on the silicon substrate 10. For example, the silicon substrate 10 is formed of monocrystalline silicon. Multiple stacked bodies 20 may be provided in the memory device 1.

In the specification hereinbelow, an XYZ orthogonal coordinate system is employed for convenience of description. Two mutually-orthogonal directions parallel to a major surface 10a of the silicon substrate 10 are taken as an "X-direction" and "Y-direction;" and a direction perpendicular to the major surface 10a of the silicon substrate 10 is taken as a "Z-direction." Also, although a direction that is in the Z-direction from the silicon substrate 10 toward the stacked body 20 also is called "up" and a direction that is in the Z-direction from the stacked body 20 toward the silicon substrate 10 also is called "down," these notations are for convenience and are independent of the direction of gravity.

The configuration of the stacked body 20 is substantially a truncated quadrilateral pyramid. The configurations of two X-direction end portions 20a of the stacked body 20 are staircase configurations. The upper surface of a central portion 20b positioned between the two end portions 20a is substantially flat. The configurations of the two Y-direction end portions of the stacked body 20 may be staircase configurations or may be substantially perpendicular.

In the stacked body 20 as shown in FIG. 2A to FIG. 2C, insulating films 21 and electrode films 22 are stacked alternately along the Z-direction. For example, the insulating films 21 are formed of an insulating material such as silicon oxide, etc.; and, for example, the electrode films 22 are formed of a conductive material such as tungsten, etc. Gaps may be disposed instead of the insulating films 21 between the multiple electrode films 22 arranged along the Z-direction; and the stacked body 20 may be formed by alternately stacking the gaps and the electrode films 22 along the Z-direction.

Also, the stacked body 20 is divided into multiple portions by multiple insulating members 23. The configurations of the insulating members 23 are flat sheet configurations spreading along the XZ plane and subdividing the stacked body 20 into multiple portions arranged along the Y-direction. Therefore, in the stacked body 20, the divided multiple electrode films 22 are arranged in a matrix configuration along the Y-direction and the Z-direction.

Terraces T and steps S that correspond to the electrode films 22 are formed in the end portion 20a. The terrace T is the upper surface of the portion of the electrode film 22 where the other electrode films 22 are not disposed in the region directly above the electrode film 22; and the terrace T is substantially parallel to the XY plane. Each of the terraces T is disposed between the two insulating members 23 arranged along the Y-direction. Also, the step S refers to the perpendicular surface or the tilted surface between the two terraces T adjacent to each other in the X-direction. The step S is the surface made of the end surface of one electrode film 22 and the end surface of one insulating film 21, and is substantially parallel to a plane including the Y-direction.

All of the insulating films 21 and all of the electrode films 22 are stacked in the central portion 20b of the stacked body 20. The central portion 20b is used as a memory cell region; and multiple memory cells are formed. The configuration of the memory cell is described in detail in a second embodiment described below.

An inter-layer insulating film 24 is provided on the silicon substrate 10 to cover the stacked body 20. Multiple contacts C are provided inside the inter-layer insulating film 24. The contacts C extend in the Z-direction; and the lower ends of the contacts C are connected to the terraces T of the electrode films 22. For example, the multiple contacts C are arranged in a matrix configuration along the X-direction and the Y-direction.

Also, in the memory device 1 according to the embodiment, other than the step S corresponding to the electrode films 22 of the lowermost level of the stacked body 20, the surfaces having the band configurations made of the multiple steps S arranged along the Y-direction are curved to be more concave toward the surface disposed on the lower level side of the stacked body 20 so that the Y-direction central portion is positioned further on the inner side of the stacked body 20 than the two Y-direction end portions. On the other hand, the step S of the lowermost level has a planar configuration extending in the Y-direction; and the lower edge of the step S of the lowermost level is an end edge E in the X-direction of the stacked body 20. Therefore, for the multiple steps S that are arranged along the Y-direction other than the step S of the lowermost level, a distance W to the end edge E is shorter as the step S is more proximal to the Y-direction end portion. Also, for the multiple terraces T arranged along the Y-direction other than the terraces T corresponding to the electrode films 22 of the lowermost level of the stacked body 20, the length in the X-direction is longer as the terrace T is more proximal to the Y-direction end portion.

Also, the multiple contacts C that are connected to the multiple terraces T arranged along the Y-direction are arranged along a straight line extending in the Y-direction. Therefore, for the multiple terraces T that are arranged along the Y-direction other than the terraces T corresponding to the electrode films 22 of the lowermost level of the stacked body 20, distance L between the contact C connected to one terrace T and the step S disposed on the lower level side of the one terrace T is longer as the terrace T is more proximal to the Y-direction end portion. In the case where multiple contacts C are connected to one terrace T, the distance L is taken as the distance between the step S on the lower level side and the contact. C most proximal to the step S on the lower level side.

A specific description is as follows. In the description hereinbelow, unique reference numerals are assigned to several terraces T to individually identify the multiple terraces T. This is done similarly for the steps S and the contacts C as well.

Among the multiple terraces T formed in the end portion 20a of the stacked body 20, the multiple terraces T disposed in the end portion in the Y-direction of the stacked body 20 and arranged along the X-direction are called a terrace Te1, a terrace Te2, a terrace Te3, a terrace Te4, and a terrace Te5 in order from the lower level side. Also, the lengths in the X-direction of the terraces Te2 to Te5 are taken as lengths A2 to A5. The terrace Te1 is not limited to the terrace T of the lowermost level of the stacked body 20; and the terrace Te5 is not limited to the terrace T of the uppermost level of the stacked body 20.

Also, the multiple terraces T disposed in the central portion in the Y-direction of the stacked body 20 and arranged along the X-direction are called a terrace Tc1, a terrace Tc2, a terrace Tc3, a terrace Tc4, and a terrace Tc5 in order from the lower level side. Also, the lengths in the X-direction of the terraces Te2 to Tc5 are respectively taken as lengths B2 to B5. The terrace Te1 and the terrace Tc1 are in the same level; the terrace Te2 and the terrace Tc2 are in the same level; and the terrace Te3 and the terrace Tc3 are in the same level. Two terraces T being in the same level refers to the two terraces T corresponding to the two electrode films 22 positioned at the same level when counting along the Z-direction from the silicon substrate 10 side. For example, the distance between the terrace Te1 and the terrace Tc1 in the Z-direction is shorter than the distance between the terrace Te1 and the terrace Te2 in the Z-direction. The central portion of the stacked body 20 is not a rigorous concept and may not always be a portion including the center line of the stacked body 20. For example, it is sufficient for the distance between the terrace Tc1 and the center line extending in the X-direction of the stacked body 20 to be shorter than the distance between the center line and the terrace Te1.

Also, the contact C that is connected to the terrace Te2 is called a contact Ce2; the contact C that is connected to the terrace Te3 is called a contact Ce3; and the contact C that is connected to the terrace Tc2 is called a contact Cc2.

Further, the step S that is between the terrace Te1 and the terrace Te2 is called a step Se1; the step S that is between the terrace Te2 and the terrace Te3 is called a step Se2; the step that is between the terrace Te3 and the terrace Te4 is called a step Se3; and the step that is between the terrace Te4 and the terrace Te5 is called a step Se4. Similarly, the step S that is between the terrace Tc1 and the terrace Tc2 is called a step Sc1; and the step S that is between the terrace Tc2 and the terrace Tc3 is called a step Sc2.

Also, a distance W1 is shorter than a distance W2, where W1 is the distance between the step Se1 and the end edge E in the X-direction at the Y-direction central portion of the step Se1, and W2 is the distance between the step Sc1 and the end edge E in the X-direction at the Y-direction central portion of then step Sc1. In other words, W1<W2. Also, a distance W3 is shorter than a distance W4, where W3 is the distance between the step Se2 and the end edge E in the X-direction at the Y-direction central portion of the step Se2, and W4 is the distance between the step Sc2 and the end edge E in the X-direction at the Y-direction central portion of the step Sc2. In other words, W3<W4.

In the case where the lengths in the X-direction of the terraces Tc2 to Tc5 are equal to each other, the lengths in the X-direction of the terraces Te2 to Te5 also are substantially equal to each other. In other words, if B2=B3=B4=B5, substantially A2=A3=A4=A5. However, A2>B2, A3>B3, A4>B4, and A5>B5.

Also, a distance L1 is longer than a distance L2, where L1 is the distance between the contact Ce2 and the step Se1, and L2 is the distance between the contact Cc2 and the step Sc1. In other words, L1>L2.

A method for manufacturing the memory device according to the embodiment will now be described.

Figure 3:
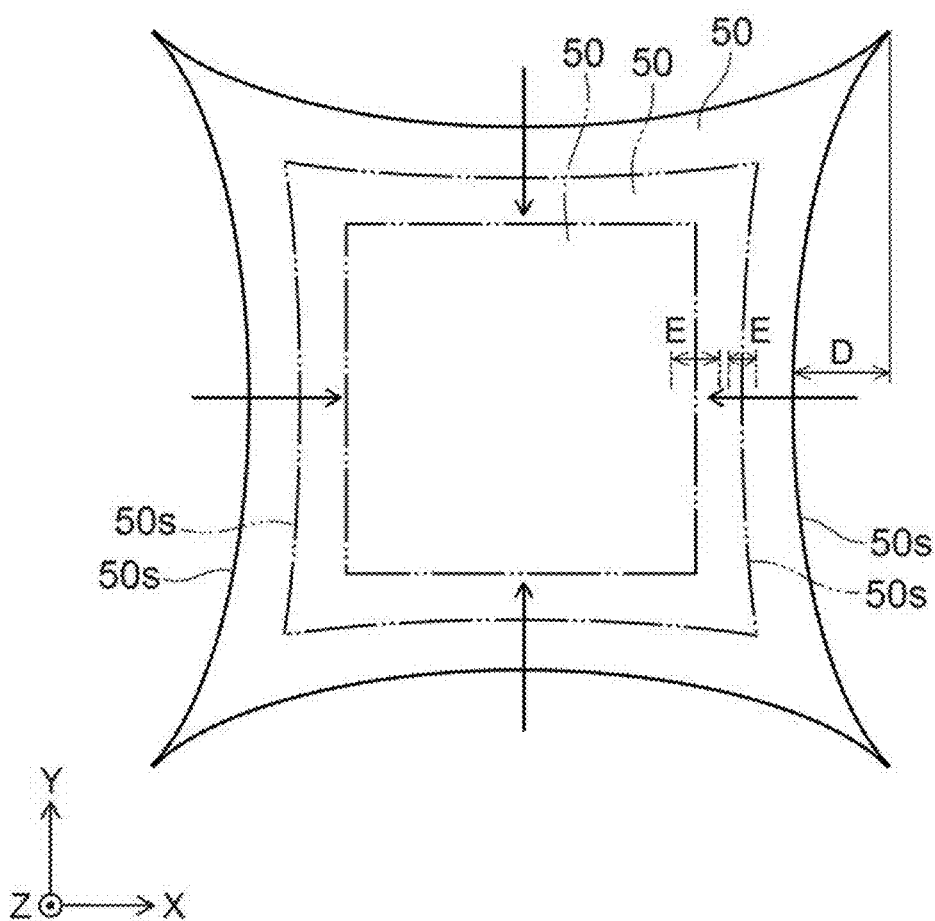
FIG. 3 is a plan view showing a resist pattern used in a method for manufacturing the memory device according to the first embodiment.

FIG. 3 is a plan view showing a resist pattern used in the method for manufacturing the memory device according to the embodiment.

FIG. 4A to FIG. 9C are drawings showing the method for manufacturing the memory device according to the embodiment.

Figure 4A:
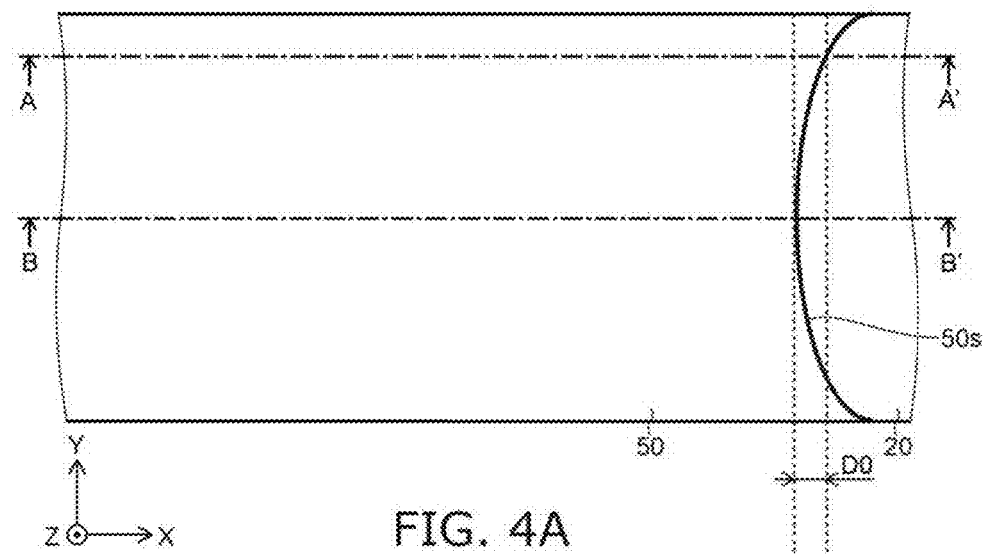
FIG. 4A to FIG. 9C are drawings showing the method for manufacturing the memory device according to the first embodiment.
Figure 4B:
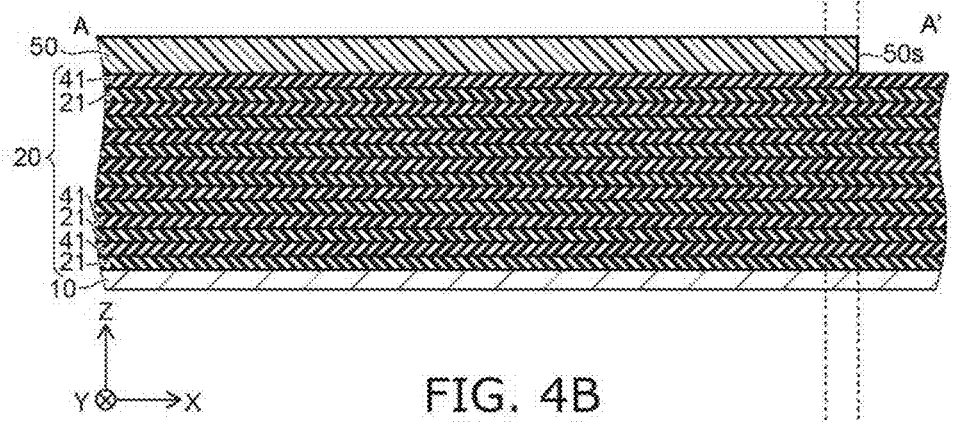
Figure 4C:
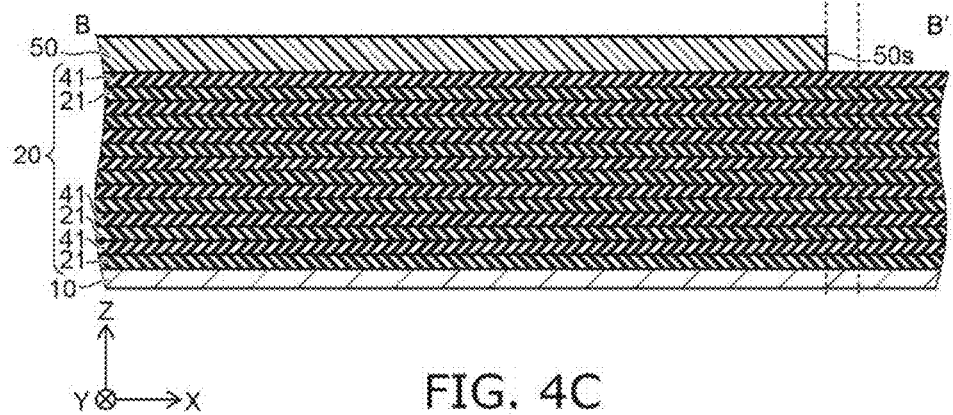

FIG. 4A is a plan view; FIG. 4B is a cross-sectional view along line A-A' shown in FIG. 4A; and FIG. 4C is a cross-sectional view along line B-B' shown in FIG. 4A. This is similar for FIG. 5A to FIG. 9C as well.

In the method for manufacturing the memory device according to the embodiment as shown in FIG. 3, a resist pattern 50 is formed on the stacked body 20; and the end portion 20a of the stacked body 20 is patterned into a staircase configuration by alternately repeating etching using the resist pattern 50 as a mask and slimming of the resist pattern 50.

In the embodiment, the initial configuration of the resist pattern 50 is set to be a configuration in which at least a side surface 50s facing the X-direction is curved to be concave when viewed from the Z-direction. For example, the configuration of the resist pattern 50 when viewed from the Z-direction is set to be a quadrilateral in which all of the side surfaces are curved to be concave and the corners are acute. The length in the X-direction of the Y-direction end portion of the resist pattern 50 is longer than the length in the X-direction of the Y-direction central portion. Hereinbelow, a "shape difference D" is the absolute value of the difference between the positions in the X-direction of the central portion and the Y-direction end portion of the resist pattern 50. In the initial state, the shape difference D has a value greater than zero. FIG. 3 illustrates the shape difference D as being exaggerated.

On the other hand, when slimming the resist pattern 50, the recessed amount of the side surface 50s fluctuates unavoidably within a constant range. An error E is the absolute value of the difference between the design value and the actual position of the side surface 50s after the slimming. The shape precision of the end portion 20a increases as the total amount of the shape difference D and the error E decrease.

The error E increases as the slimming of the resist pattern 50 is repeated because the error E accumulates with each slimming. On the other hand, as the slimming of the resist pattern 50 is performed, the end portion recedes more than the central portion at the side surface of the resist pattern 50. In other words, the corners of the resist pattern 50 are removed. Therefore, as the slimming is repeated, the configuration of the resist pattern 50 approaches a rectangle when viewed from the Z-direction; and the shape difference D decreases.

Therefore, according to the embodiment, when repeating the slimming, the increase of the error E and the decrease of the shape difference D are canceled; and good shape precision can be maintained as an entirety.

A specific description is as follows. The example described below is an example in which the end portion 20a is patterned into a staircase configuration using one resist pattern 50.

First, as shown in FIG. 4A to FIG. 4C, the stacked body 20 is formed by alternately stacking the insulating films 21 and sacrificial films 41 on the silicon substrate 10. For example, the insulating films 21 are formed of silicon oxide. The sacrificial films 41 are formed of a material that can have etching selectivity with the insulating films 21 and are formed of, for example, silicon nitride.

Then, the resist pattern 50 is formed on the stacked body 20. As shown in FIG. 3, the resist pattern 50 is a quadrilateral in which the four side surfaces facing the X-direction and the Y-direction each are curved to be concave and each of the corners is acute when viewed from the Z-direction. The resist pattern 50 exposes a portion of the stacked body 20 and covers the remainder. D0 is the shape difference of the side surface 50s facing the X-direction at this time.

Figure 5A:
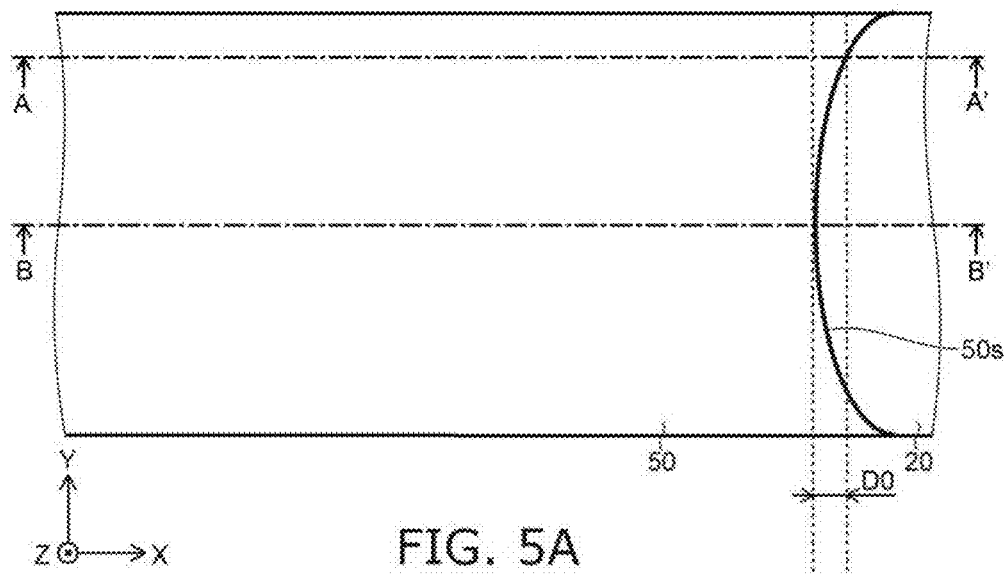
Figure 5B:
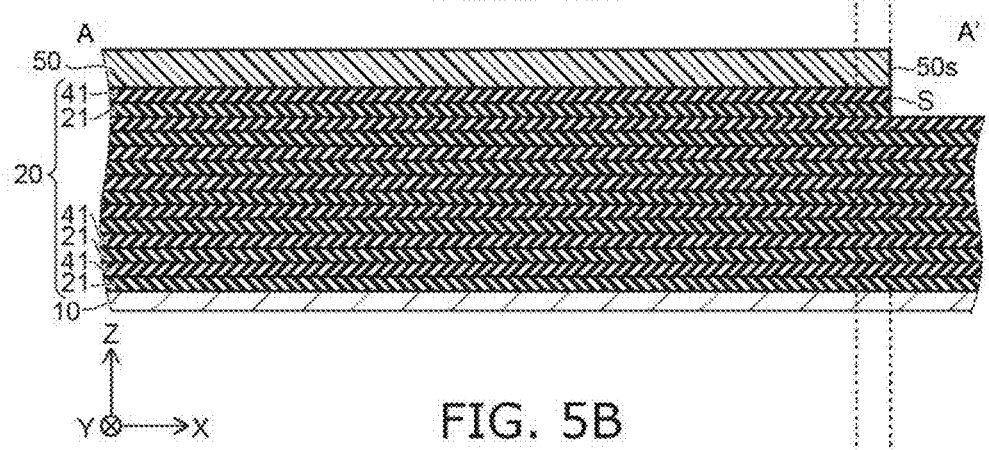
Figure 5C:
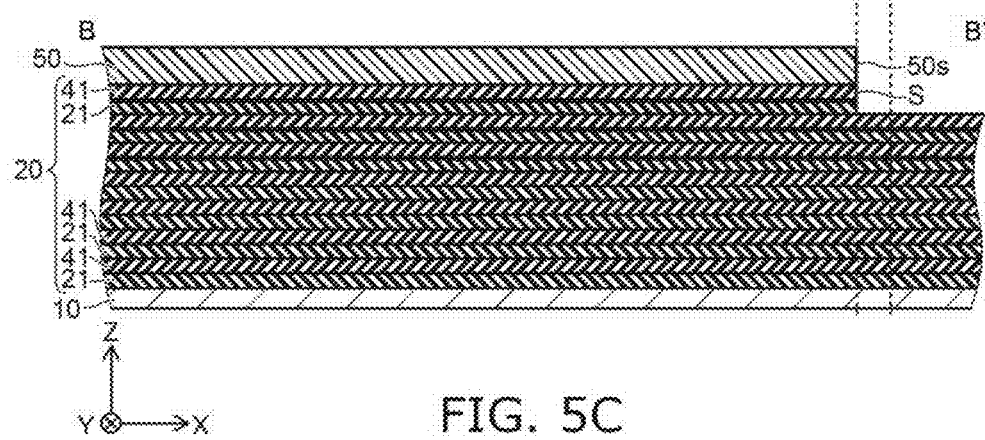

Then, as shown in FIG. 5A to FIG. 5C, etching, e.g., RIE (Reactive Ion Etching) is performed using the resist pattern 50 as a mask. Thereby, one step S is formed by removing one sacrificial film 41 and one insulating film 21 at the portion of the stacked body 20 not covered with the resist pattern 50.

Figure 6A:
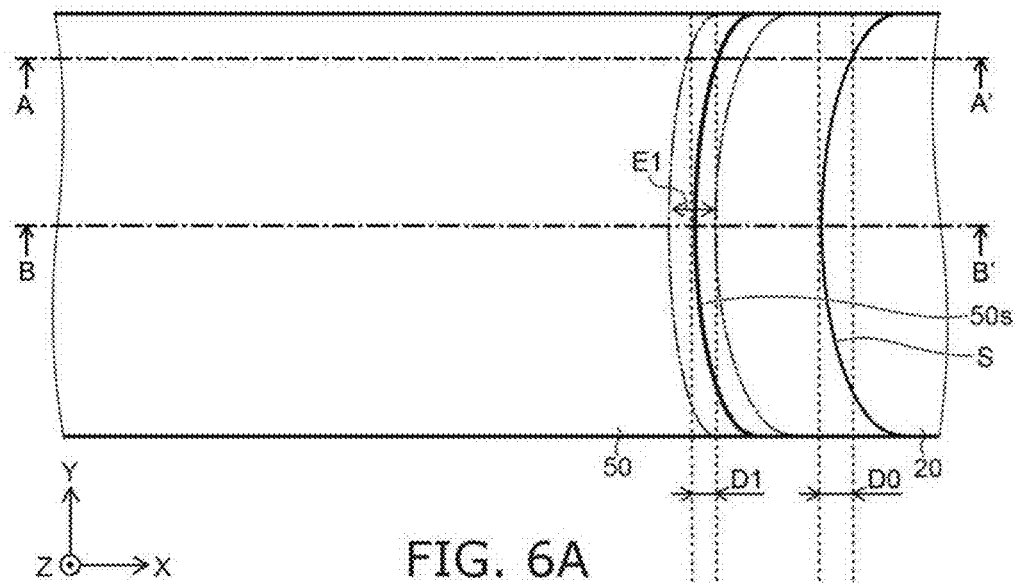
Figure 6B:
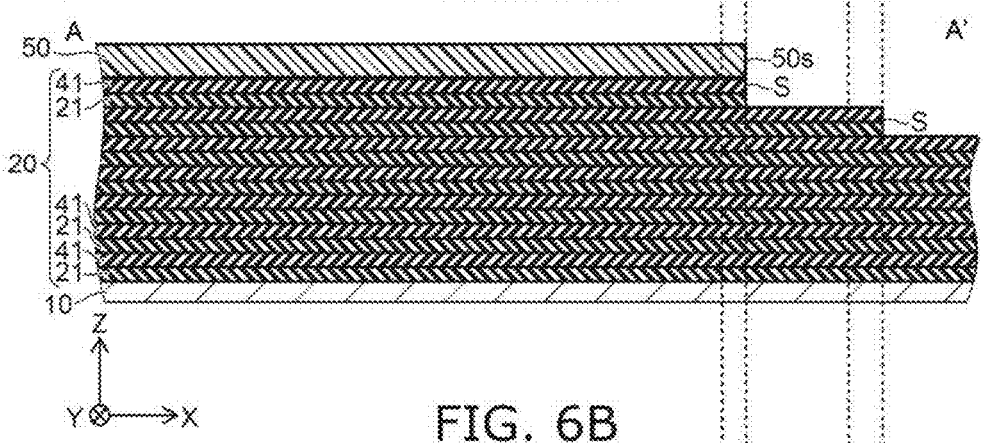
Figure 6C:
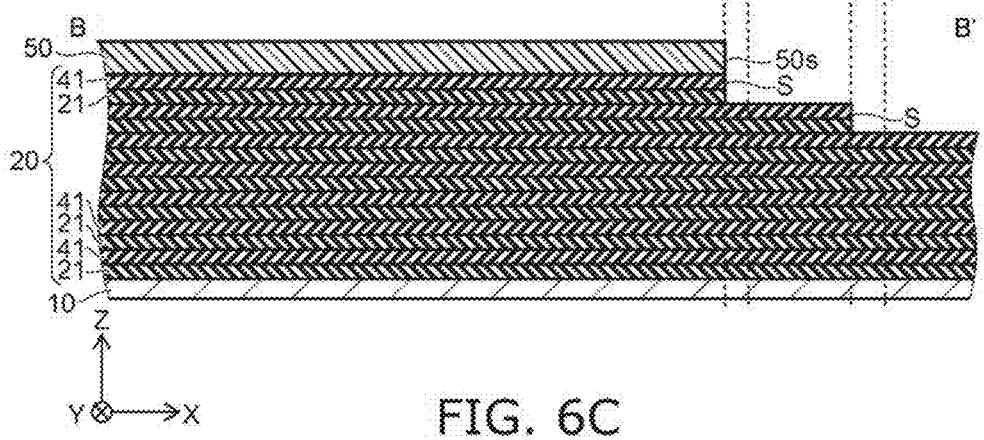

Then, as shown in FIG. 6A to FIG. 6C, slimming of the resist pattern 50 is performed by performing, for example, ashing processing. Thereby, the resist pattern 50 becomes one size smaller. At this time, an error E1 of the slimming occurs. On the other hand, in the side surface 50s facing the X-direction of the resist pattern 50, a shape difference D1 becomes smaller than the initial shape difference D0 because the recessed amount of the two Y-direction end portions is larger than the recessed amount of the Y-direction central portion. In other words, D1<D0. A new portion of the stacked body 20 is exposed by the side surface 50s receding.

Then, etching is performed using the resist pattern 50 as a mask. Thereby, one step S is newly formed by removing one sacrificial film 41 and one insulating film 21 at the portion of the stacked body 20 not covered with the resist pattern 50. Also, the step S that is formed in the process shown in FIG. 5A to FIG. 5C is transferred to the lower level by this etching. Thereby, the steps S have a total of two levels.

Figure 7A:
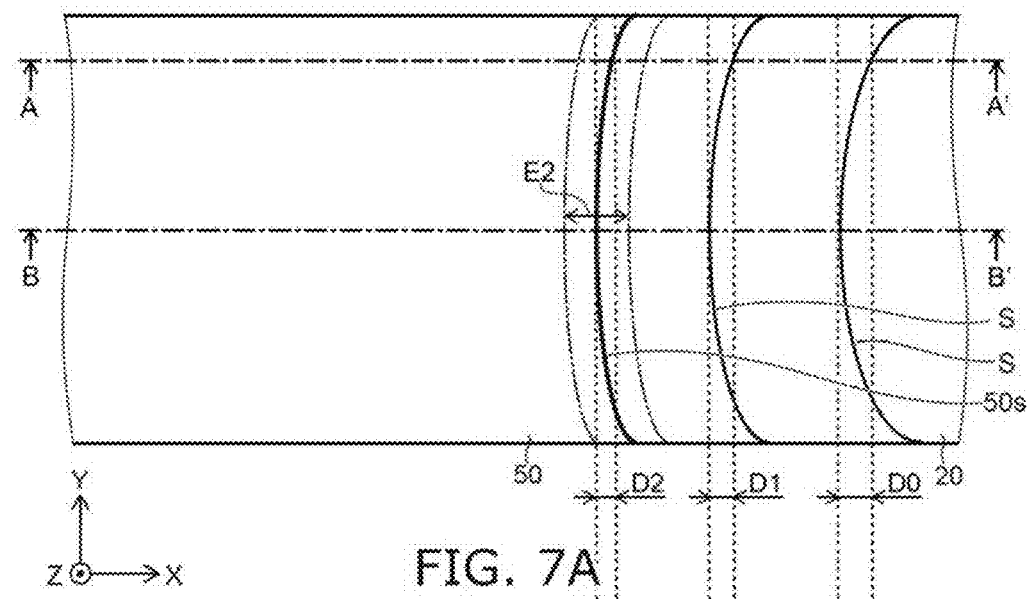
Figure 7B:
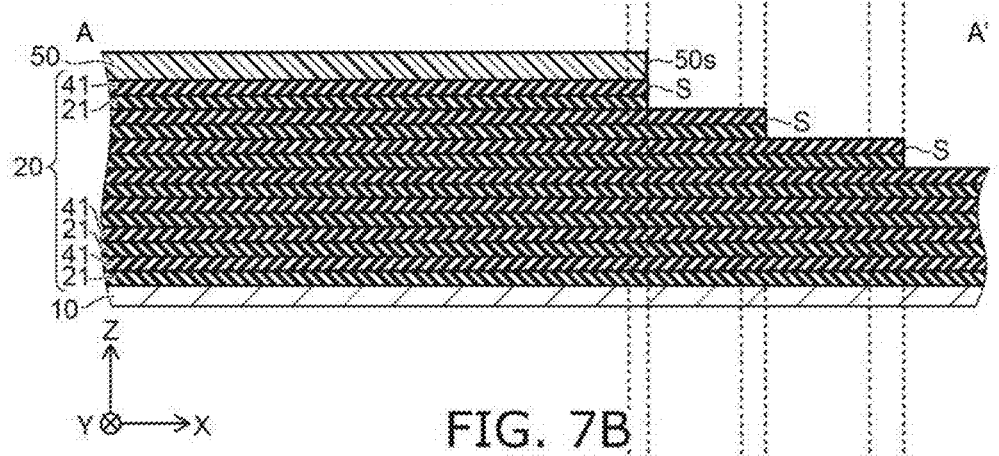
Figure 7C:
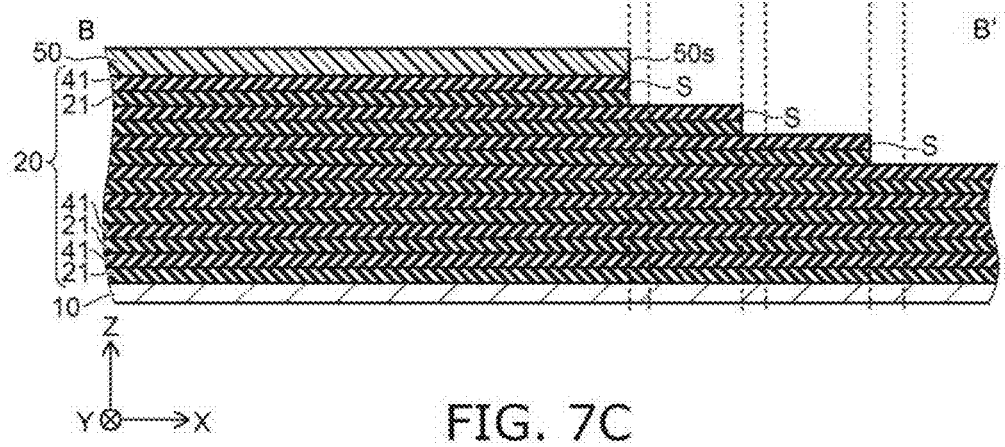

Then, as shown in FIG. 7A to FIG. 7C, slimming of the resist pattern 50 is performed. Thereby, the resist pattern 50 further becomes one size smaller; and a new portion of the stacked body 20 is exposed. Although an error E2 occurs due to the slimming at this time, the error E2 is larger than the error E1 because the error E2 accumulates with the error E1 of the previous time. In other words, E2>E1. On the other hand, in the side surface 50s, a shape difference D2 is smaller than the shape difference D1. In other words, D2<D1<D0.

Then, etching is performed using the resist pattern 50 as mask. Thereby, one step S is newly formed by removing one sacrificial film 41 and one insulating film 21 at the portion of the stacked body 20 not covered with the resist pattern 50. Also, the steps S that are already formed are transferred to the lower levels. Thereby, the steps S have a total of three levels.

Figure 8A:
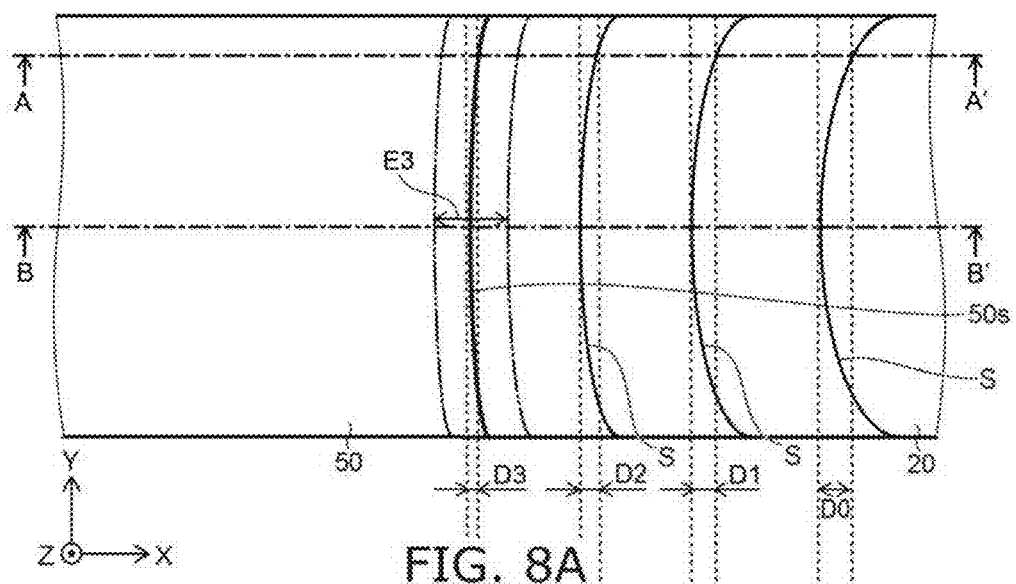
Figure 8B:
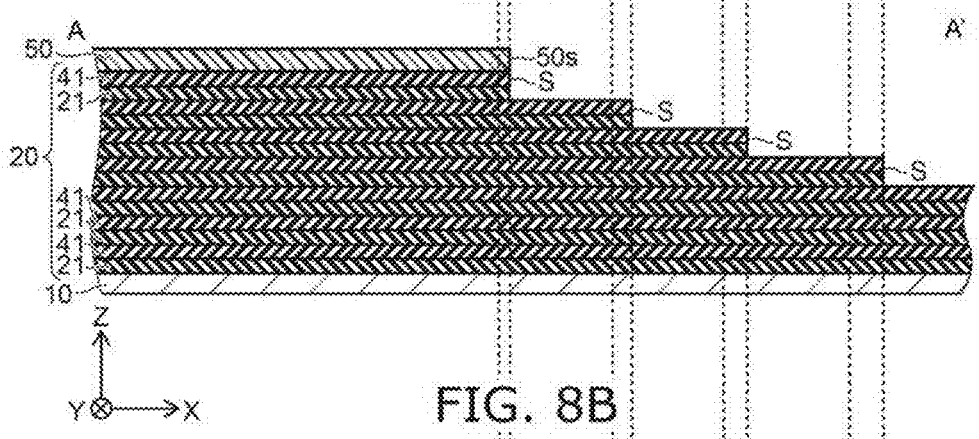
Figure 8C:
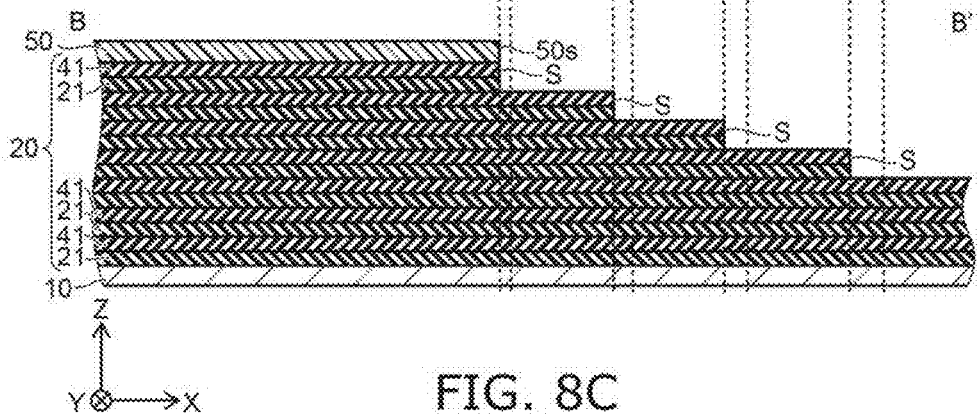

Then, slimming of the resist pattern 50 is performed as shown in FIG. 8A to FIG. 8C. An error E3 at this time is larger than the error E2 because the error E3 accumulates with the error E2 of the previous time. In other words, E3>E2>E1. On the other hand, a shape difference D3 is smaller than the shape difference D2. In other words, D3<D2<D1<D0.

Then, etching is performed using the resist pattern 50 as mask. Thereby, one step S is newly formed; and the steps S have a total of four levels.

Figure 9A:
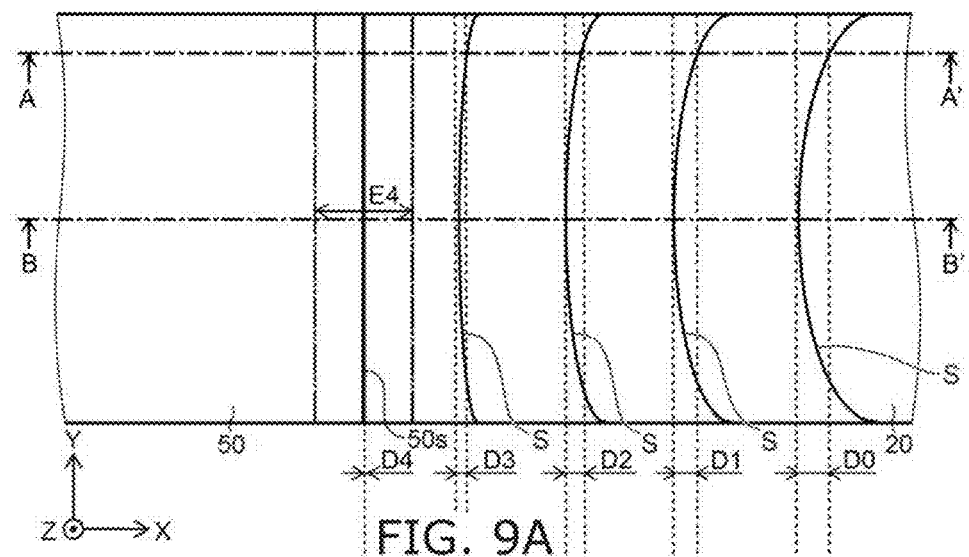
Figure 9B:
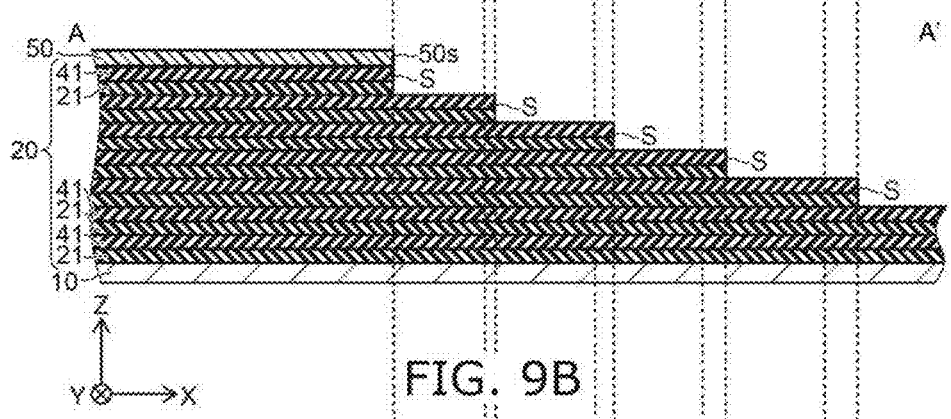
Figure 9C:
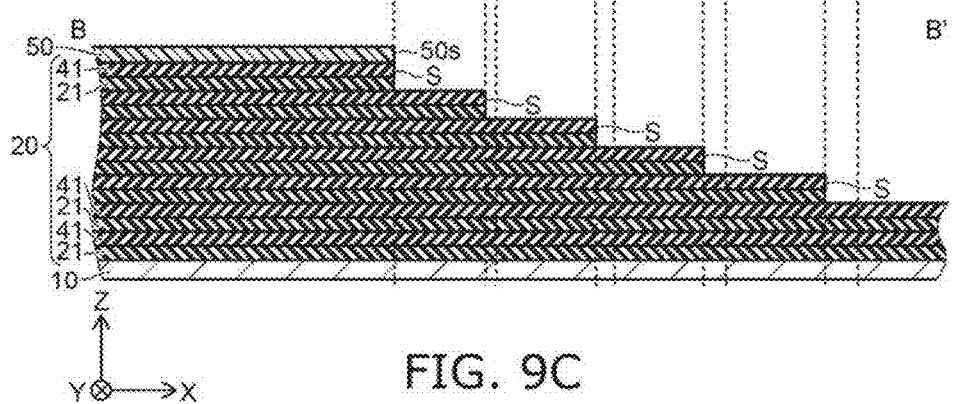

Then, slimming of the resist pattern 50 is performed as shown in FIG. 9A to FIG. 9C. An error E4 at this time is larger than the error E3 because the error E4 accumulates with the error E4 of the previous time. In other words, E4>E3>E2>E1. On the other hand, a shape difference D4 of the resist pattern 50 is smaller than the shape difference D3. In other words, D4<D3<D2<D1<D0.

Then, etching is performed using the resist pattern 50 as a mask. Thereby, one step S is newly formed; and the steps S have a total of five levels.

Thereafter, the slimming of the resist pattern 50 and the etching using the resist pattern 50 as the mask are repeated. Thereby, the multiple terraces T (referring to FIG. 2A to FIG. 2C) that are arranged along the X-direction are formed by patterning the end portion 20a of the stacked body 20 into the staircase configuration. Subsequently, the resist pattern 50 is removed. Then, by forming a resist pattern (not illustrated) that is rectangular when viewed from the Z-direction and by performing etching using the resist pattern as a mask, the stacked body 20 is partitioned from the periphery by removing the sacrificial film 41 of the lowermost level and the insulating film 21 of the lowermost level at the portion not covered with the resist pattern. At this time, the end edge E facing the x-direction of the stacked body 20 (referring to FIG. 2A to FIG. 2C) is formed.

Then, as shown in FIG. 2A to FIG. 2C, the inter-layer insulating film 24 is formed to cover the stacked body 20 by depositing, for example, silicon oxide. Then, major portions of the memory cells (not illustrated) are formed inside the stacked body 20. Then, slits ST that extend in the X-direction are formed in the stacked body 20. Thereby, the stacked body 20 is subdivided into multiple portions in the Y-direction. As a result, the terraces T and the steps S also are divided in the Y-direction.

Then, the sacrificial films 41 (referring to FIG. 9B and FIG. 9C) are removed via the slits ST. Then, the electrode films 22 are filled, via the slits ST, into the spaces where the sacrificial films 41 are removed. Then, the insulating members 23 are filled into the slits ST. Then, the multiple contacts C are formed inside the inter-layer insulating film 24. For example, the contacts C are arranged in a matrix configuration along the X-direction and the Y-direction. The lower ends of the contacts C reach the terraces T and are connected to the electrode films 22. Thus, the memory device 1 according to the embodiment is manufactured.

In the memory device 1 as described above, the steps S are formed using the resist pattern 50 in which the side surface 50s is curved to be concave. Therefore, comparing the steps S formed in the same level, the distance between the end edge E of the stacked body 20 and the step S formed at the end portion in the Y-direction of the stacked body 20 is shorter than the distance between the end edge E and the step S formed at the central portion in the Y-direction of the stacked body 20. In other words, as shown in FIG. 2A, W1<W2 and W3<W4.

Also, because the steps S are curved to be concave when viewed from the Z-direction, in the case where the contacts C are arranged in one column along the Y-direction, the distance between the contact C connected to one terrace T and the step S on the lower level side of the one terrace T increases toward the Y-direction end portion of the stacked body 20. In other words, L1>L2.

Effects of the embodiment will now be described

In the embodiment, the initial configuration of the resist pattern 50 is set to be a configuration in which the side surface 50s facing the X-direction is curved to be concave. Thereby, the increase of the error E due to repeating the slimming can be canceled by the decrease of the shape difference D. As a result, even when the slimming is repeated, the fluctuation of the configuration for the resist pattern 50 as an entirety is suppressed; and the end portion 20a of the stacked body 20 can be patterned with high precision.

COMPARATIVE EXAMPLE

A comparative example will now be described.

Figure 10:
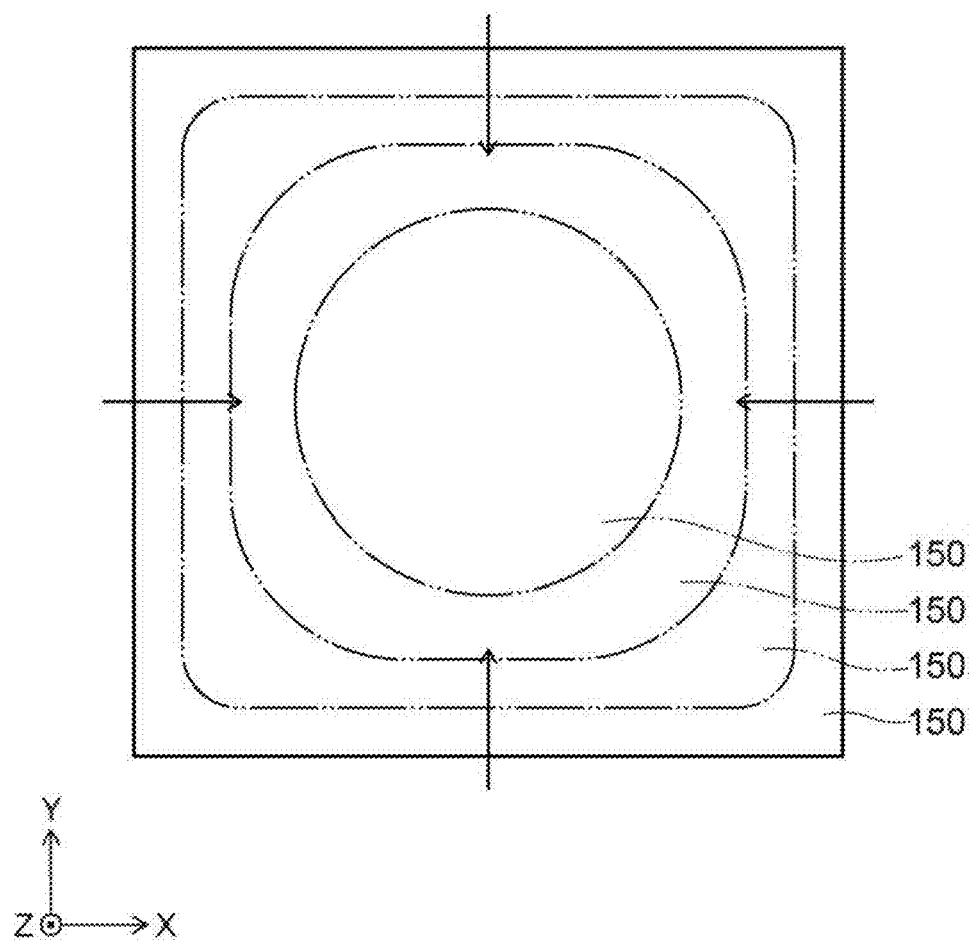
FIG. 10 is a plan view showing a resist pattern used in a method for manufacturing a memory device according to a comparative example.

FIG. 10 is a plan view showing a resist pattern used in a method for manufacturing a memory device according to the comparative example.

Figure 11:
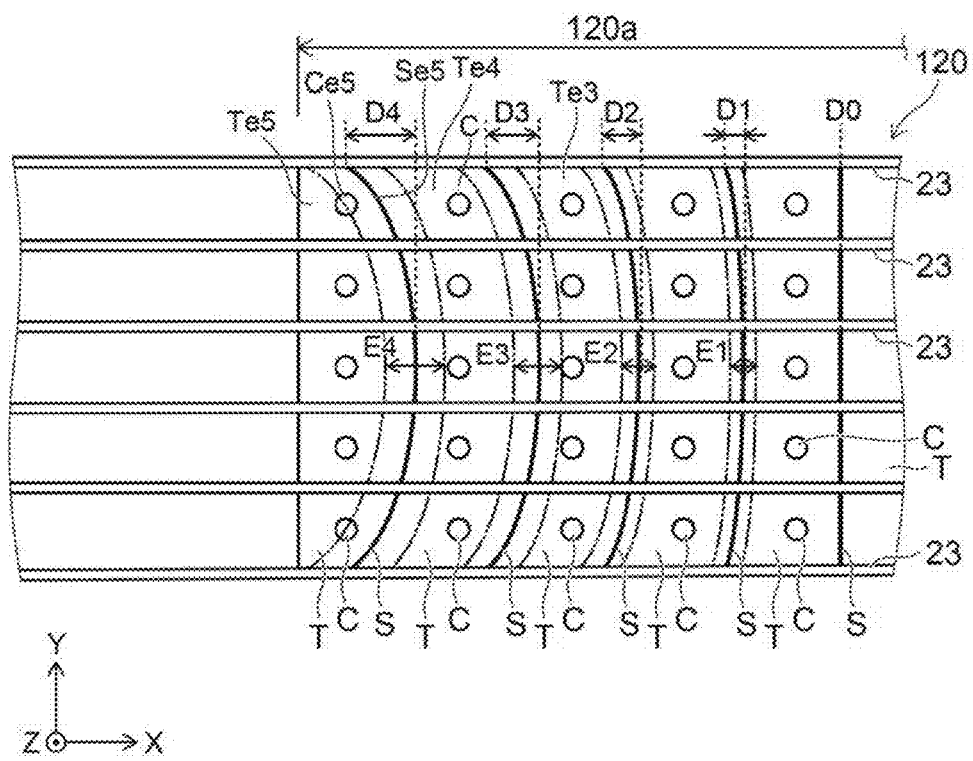
FIG. 11 is a plan view showing the method for manufacturing the memory device according to the comparative example.

FIG. 11 is a plan view showing the method for manufacturing the memory device according to the comparative example.

As shown in FIG. 10 and FIG. 11, in the method for manufacturing the memory device according to the comparative example, the initial configuration of a resist pattern 150 for patterning an end portion 120a of a stacked body 120 into a staircase configuration is set to be a rectangle. In the initial state, the shape difference D0 is substantially zero.

Then, the end portion 120a of the stacked body 120 is patterned into a staircase configuration by alternately repeating etching using the resist pattern 150 as a mask and slimming of the resist pattern 150. In such a case, as the slimming is repeated, the corners of the resist pattern 150 are rounded; and the shape difference D increases. In other words, D4>D3>D2>D1>D0. Also, for the position in the X-direction of the side surface facing the X-direction of the resist pattern 150, the error E between the actual position and the design position increases by accumulating. In other words, E4>E3>E2>E1.

Accordingly, there is a possibility that the position of a step Se5 positioned at the Y-direction end portion of the stacked body 120 which is the final step S to be patterned may be greatly shifted in the X-direction because the shape difference D4 and the error E4 are superimposed. In such a case, the possibility undesirably occurs that a contact Ce5 that should be connected to the terrace Te5 may be outside the terrace Te5 of the originally-intended connection and may be connected to the terrace Te4 of one level below. Thus, the shape precision of the comparative example is low.

Second Embodiment

A second embodiment will now be described.

Compared to the first embodiment described above, the embodiment is different in that the resist pattern is multiply formed; and the staircase is arranged in two columns.

Figure 12:
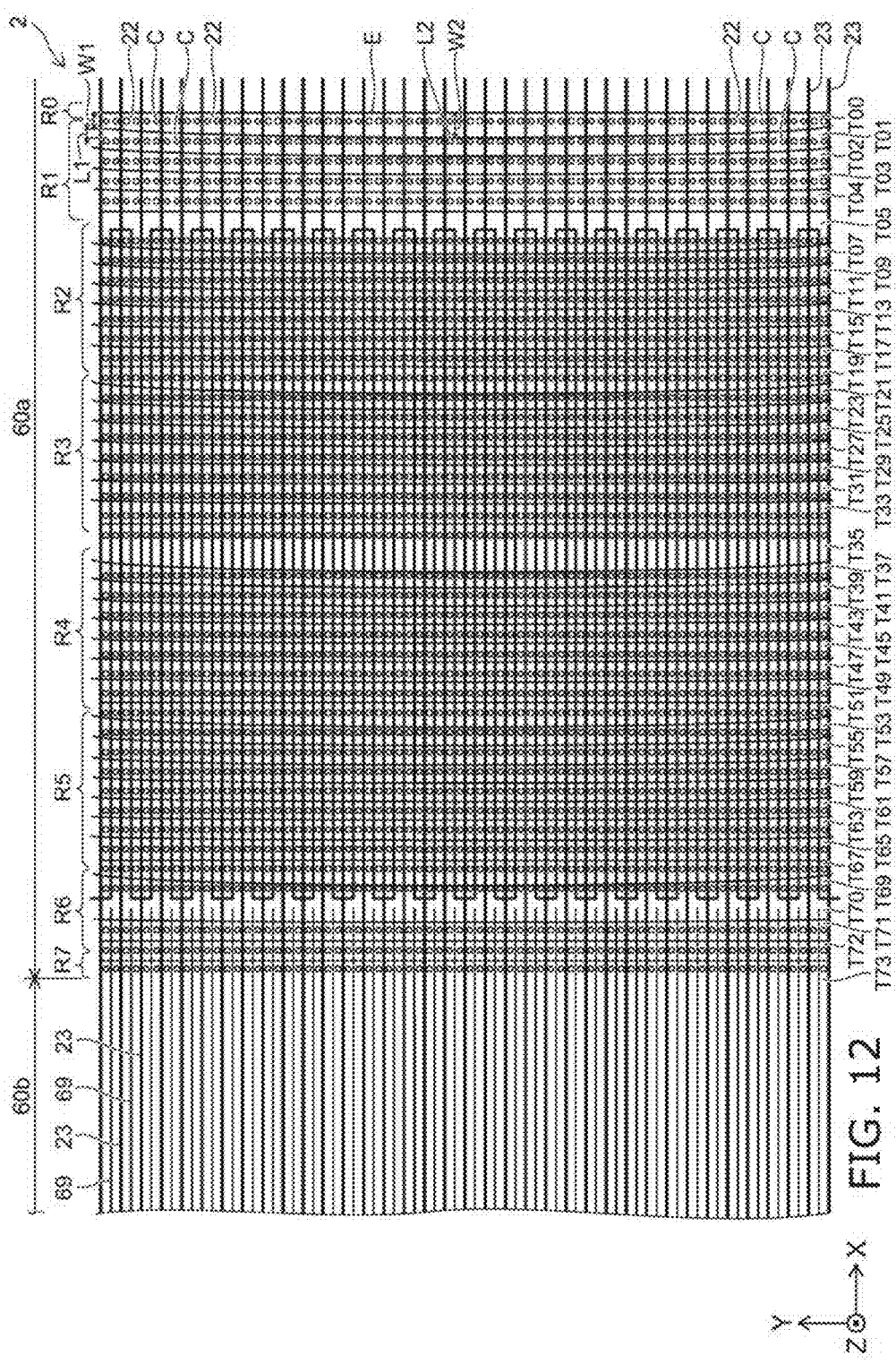
FIG. 12 is a plan view showing an end portion of a stacked body of a memory device according to a second embodiment.

FIG. 12 is a plan view showing the end portion of the stacked body of a memory device according to the embodiment.

Figure 13:
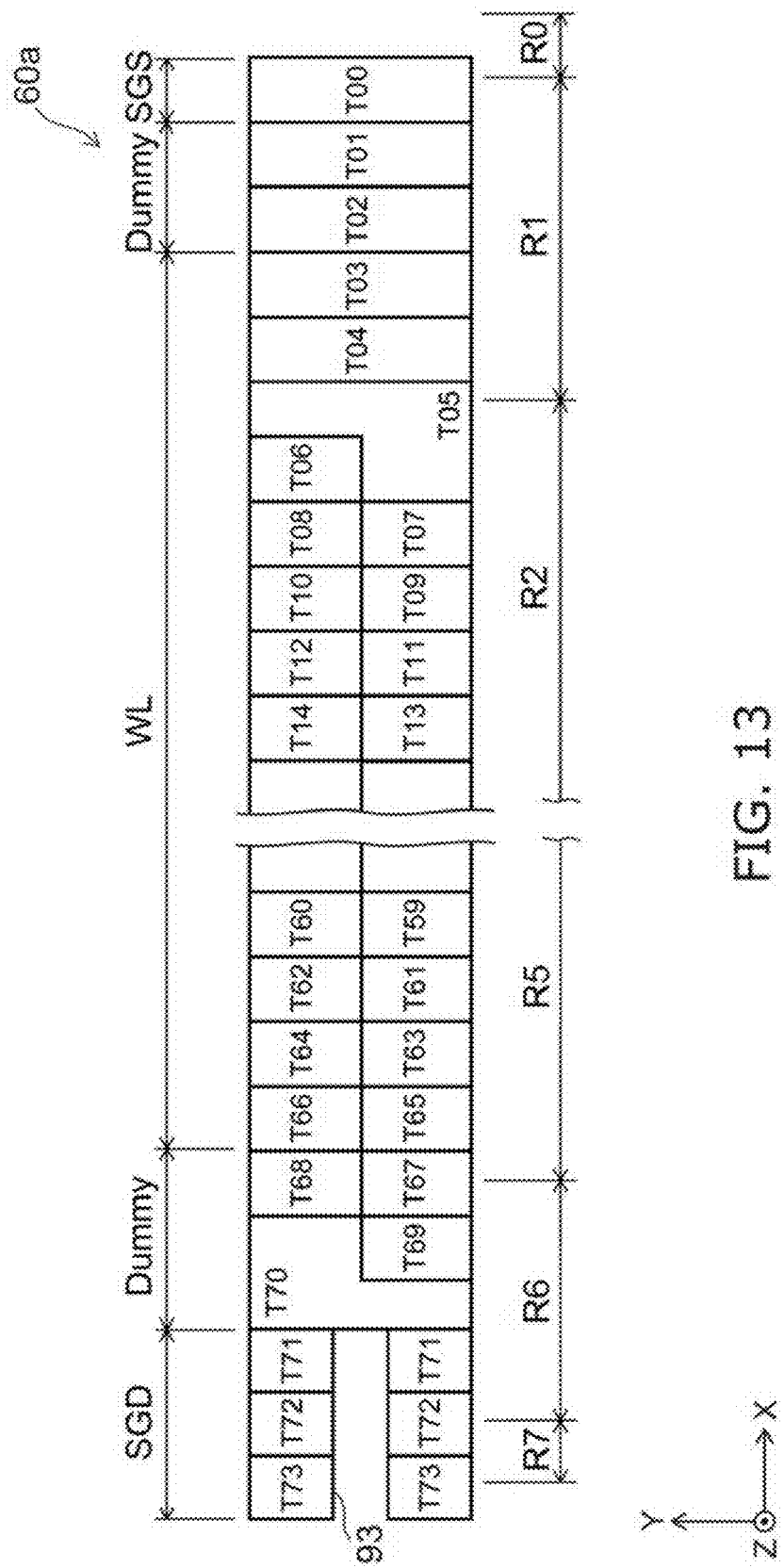
FIG. 13 is a drawing showing a terrace arrangement of the stacked body of the memory device according to the second embodiment.

FIG. 13 is a drawing showing the terrace arrangement of the stacked body of the memory device according to the embodiment.

Figure 14:
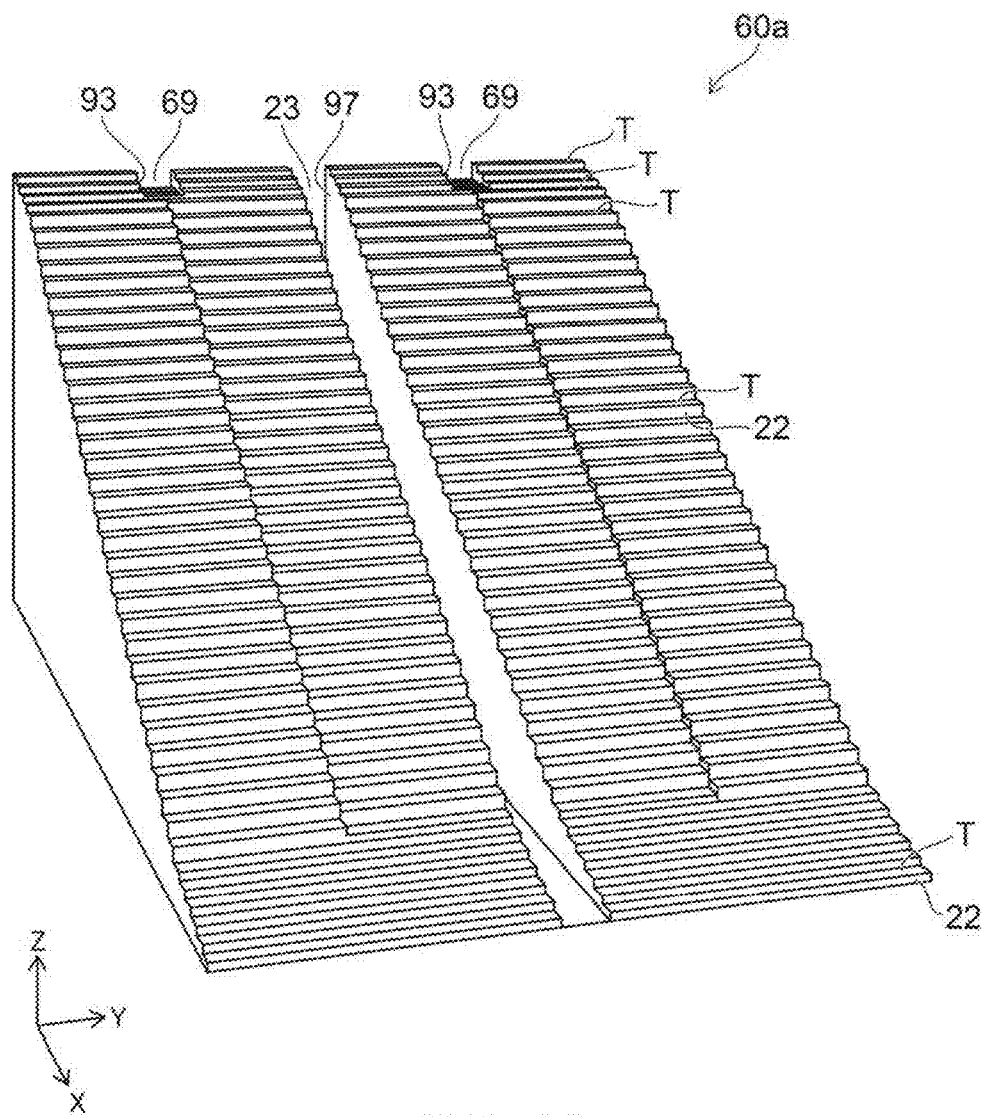
FIG. 14 is a perspective view showing the end portion of the stacked body of the memory device according to the second embodiment.

FIG. 14 is a perspective view showing the end portion of the stacked body of the memory device according to the embodiment.

Figure 15:
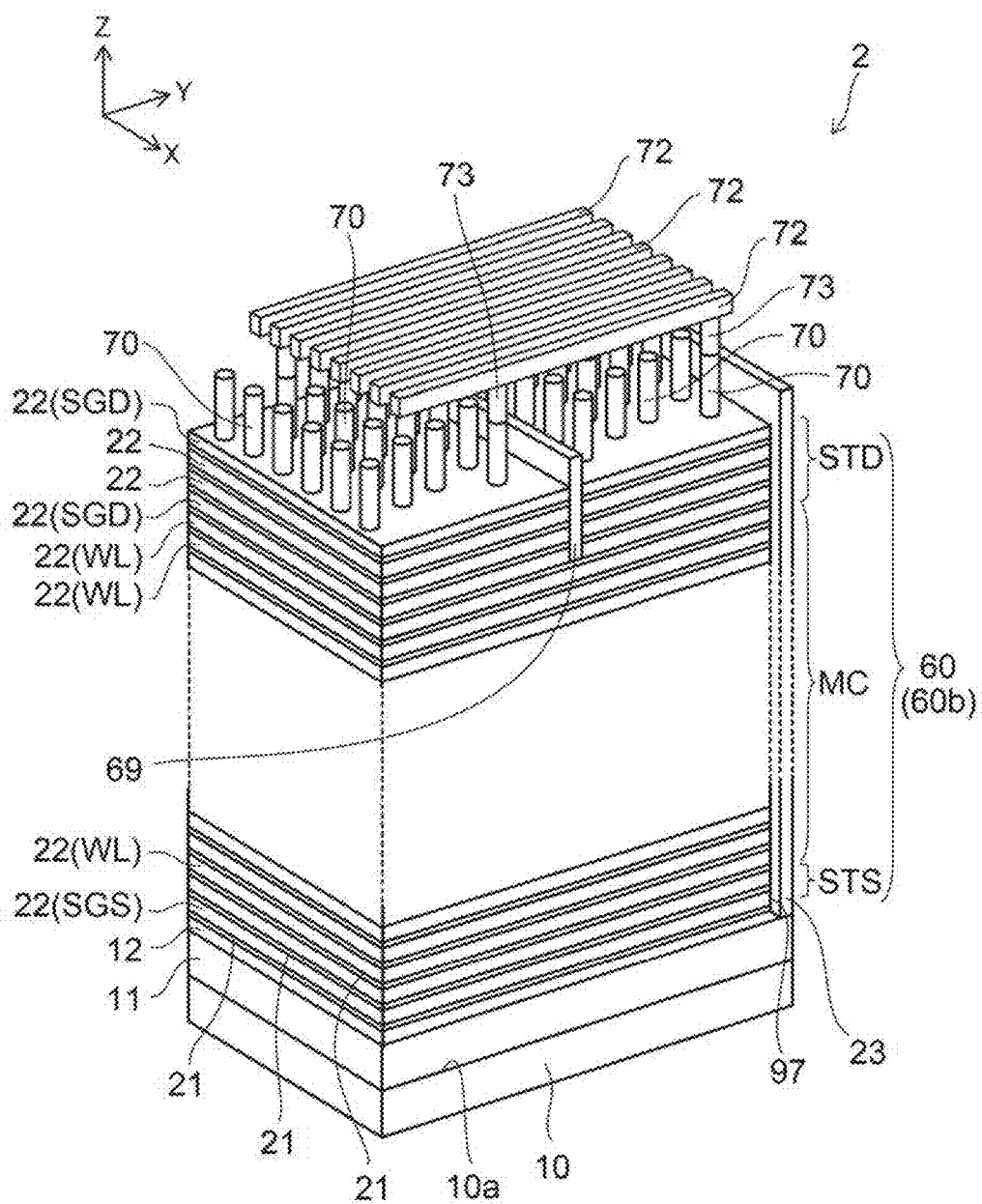
FIG. 15 is a perspective view showing a central portion of the stacked body of the memory device according to the second embodiment.

FIG. 15 is a perspective view showing the central portion of the stacked body of the memory device according to the embodiment.

Figure 16:
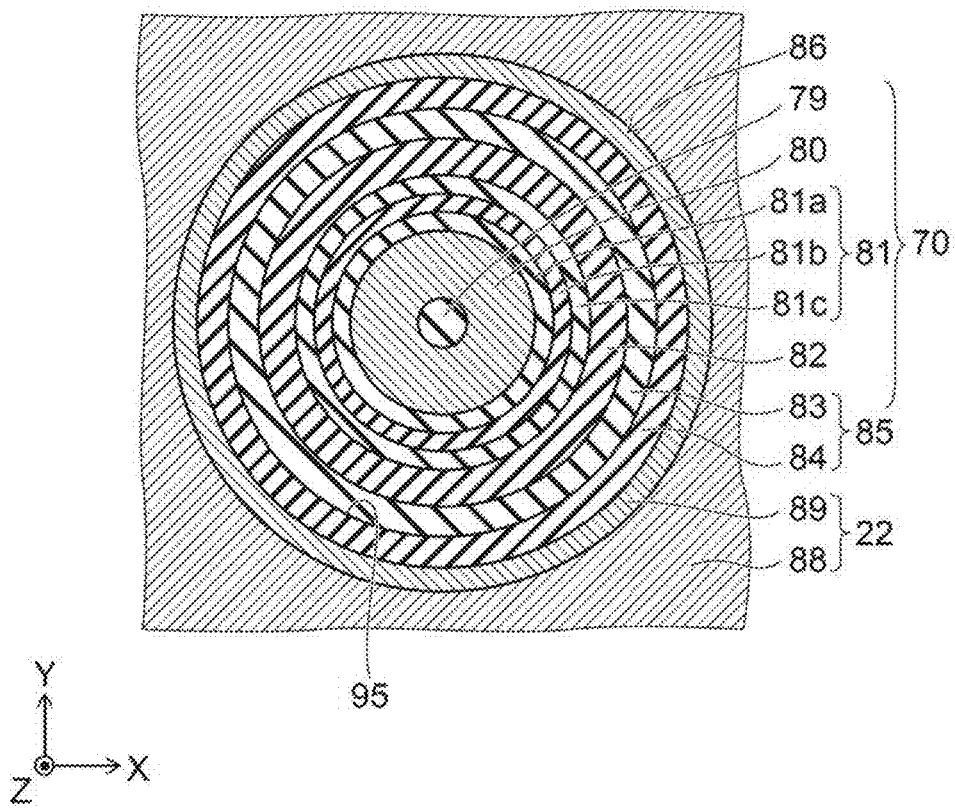
FIG. 16 is a cross-sectional view showing a memory cell periphery of the memory device according to the second embodiment.

FIG. 16 is cross-sectional view showing the memory cell periphery of the memory device according to the embodiment.

Figure 17:
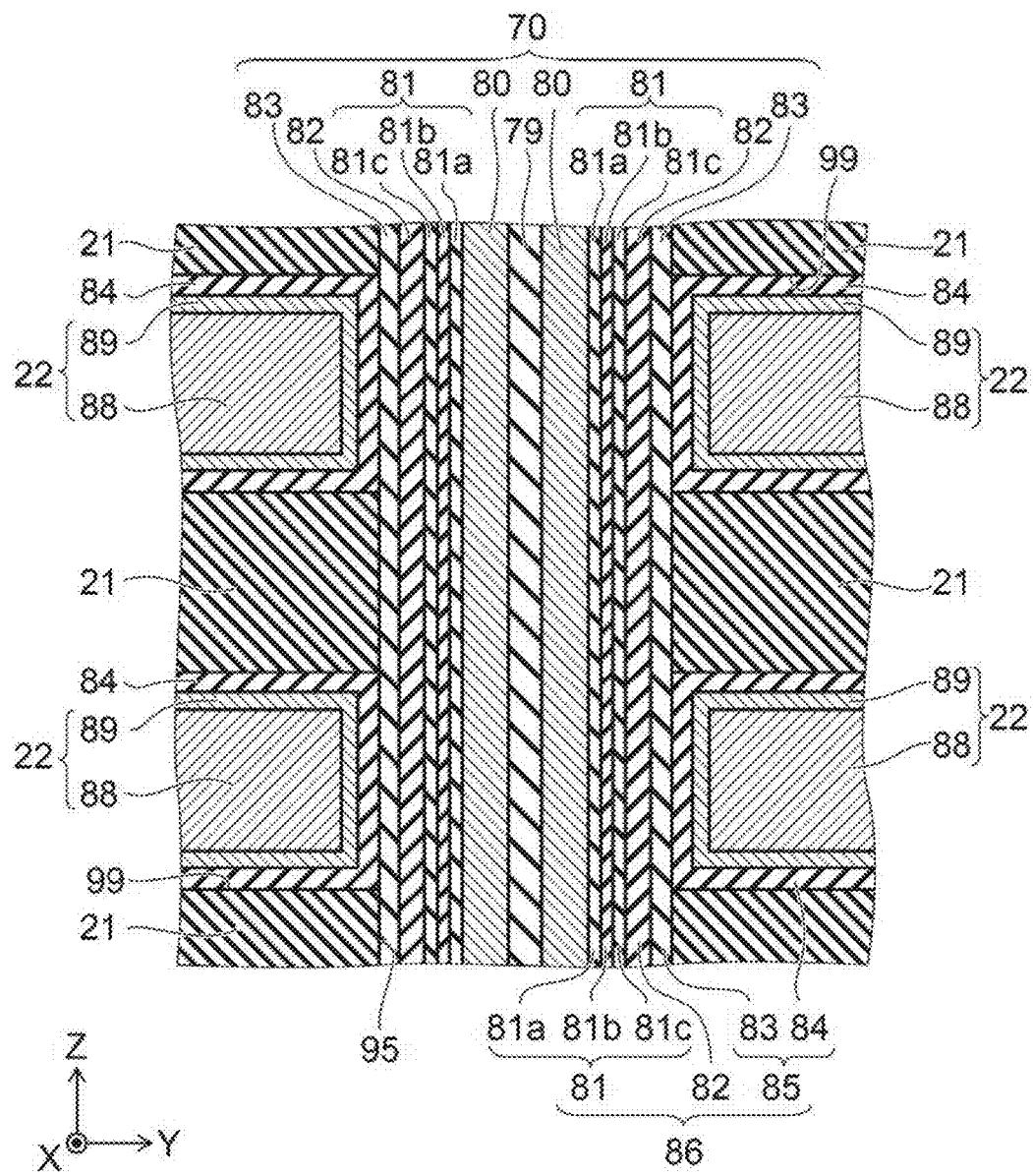
FIG. 17 is a cross-sectional view snowing the memory cell periphery of the memory device according to the second embodiment.

FIG. 17 is a cross-sectional view showing the memory cell periphery of the memory device according to the embodiment.

As shown in FIG. 15, the silicon substrate 10 is provided in the memory device 2 according to the embodiment. An insulating film 11 is provided on the silicon substrate 10. A drive circuit (not illustrated) is formed inside the insulating film 11 and the upper layer portion of the silicon substrate 10. A conductive film 12 is provided on the insulating film 11. In the conductive film 12, for example, a polysilicon layer (not illustrated) is stacked on a metal layer (not illustrated). A stacked body 60 is provided on the conductive film 12. The insulating films 21 and the electrode films 22 are stacked alternately in the stacked body 60. The number of stacks of the electrode films 22 is, for example, seventy-four layers. The insulating members 23 that spread along the XZ plane are provided inside the stacked body 60.

The end portion of the stacked body will now be described.

As shown in FIG. 12 to FIG. 14, the configuration of an end portion 60a in the X-direction of the stacked body 60 is a staircase configuration; and the terraces T are formed to correspond to the electrode films 22. In FIG. 12 and FIG. 13, the terraces T of the seventy-four electrode films 22 are displayed as being marked with the numerals of "T00" to "T73" in order from the lower level side, i.e., the silicon substrate 10 side. Terraces T00 to T04 of the five electrode films 22 from the lowermost level are arranged in one column along the X-direction in the portion interposed between two mutually-adjacent slits 97. Terraces T73 to T71 of the three electrode films 22 from the uppermost level also are arranged in one column along the X-direction. Terraces T05 to T70 of the electrode films 22 between the terraces T00 to T04 and the terraces T73 to T71 are arranged in two columns along the X-direction. For example, the terrace T07 and the terrace T08 are arranged along the Y-direction. Also, in the terraces T05 to T70, the step S that extends in the Y-direction is formed every two electrode films 22; and one step S that extends in the X-direction is formed for one electrode film 22.

For example, the electrode film 22 that corresponds to the terrace T00 is a lower selection gate line SGS. The electrode films 22 that correspond to the terraces T01 to T02 are dummy electrodes that do not function electrically. The electrode films 22 that correspond to the terrace T03 to the terrace T66 are word lines WL. The electrode films 22 that correspond to the terraces T67 to T70 are dummy electrodes. The electrode films 22 that correspond to the terraces T71 to T73 are upper selection gate lines SGD. As described below, the upper selection gate line SGD is subdivided into two in the Y-direction.

In the end portion 60a, regions R0 to R7 are set in this order along the X-direction. The region R0 is disposed on the lowermost level side of the staircase configuration; and the region R7 is disposed on the uppermost level side. The region R0 includes one step S extending in the Y-direction. The region R1 includes five steps S extending in the Y-direction and being arranged along the X-direction. The region R2 includes seven steps S extending in the Y-direction and being arranged along the X-direction. The regions R3 to R5 each include eight steps S extending in the Y-direction and being arranged along the X-direction. The region R6 includes three steps S extending in the Y-direction and being arranged along the X-direction. The region R7 includes one step S extending in the Y-direction. The steps S that extend in the X-direction are formed in the regions R2 to R6. The number of regions set in the end portion 60a and the number of the steps S in each region are arbitrary.

As described below, the steps S that extend in the Y-direction and are included in each region are formed using one common resist pattern. Among these, as described in the first embodiment, the regions R1 to R6 are formed using the resist pattern in which the side surface facing the X-direction is concave. Therefore, among the steps S formed inside each region of the regions R1 to R6, the step S of the lowermost level is curved to be concave and has the largest shape difference D (referring to FIG. 3); and the curve relaxes and the shape difference D decreases toward the upper level.

Accordingly, in each of the regions R1 to R6, among the multiple steps S arranged along the Y-direction, the distance W1 between the end edge E of the stacked body 60 and the step S disposed at the Y-direction end portion of the stacked body 60 shorter than the distance W2 between the end edge E and the step S disposed at the Y-direction central portion of the stacked body 60. In other words, W1<W2.

Also, in each of the regions R1 to R6, among the multiple terraces T arranged along the Y-direction, the distance L1 between, the contact C connected to the terrace T disposed at the Y-direction end portion of the stacked body 60 and the step S on the lower level side of this terrace T is longer than the distance L2 between the contact C connected to the terrace T disposed at the Y-direction central portion of the stacked body 60 and the step S on the lower level side of this terrace T. In other words, L1>L2.

Several regions of the regions R1 to R6 may be formed using a resist pattern in which the side surface has a planar configuration in the initial configuration. For example, compared to the regions R2 to R5, the numbers of the steps S included in the regions R1 and R6 are low; therefore, the decrease of the patterning precision is low even when patterning using the resist pattern in which the side surface has the planar configuration. On the other hand, the steps that face the Y-direction all are formed by one lithography.

The central portion of the stacked body will now be described.

As shown in FIG. 15, the columnar members 70 that extend in the Z-direction and pierce the stacked body 60 are provided inside a central portion 60b of the stacked body 60. The lower ends of the columnar members 70 contact the conductive film 12; and the upper ends are exposed at the upper surface of the stacked body 60. As described below, one silicon pillar 80 that functions as channels of memory cell transistors MC, an upper selection gate transistor STD, and a lower selection gate transistor STS (referring to FIG. 16 and FIG. 17) is provided inside each of columnar members 70.

Multiple bit lines 72 that extend in the Y-direction are provided on the stacked body 60. The bit lines 72 are connected to the upper ends of the silicon pillars 80 via plugs 73. Thereby, each of the silicon pillars 80 is connected between the conductive film 12 and the bit line 72.

The upper selection gate transistor STD is configured at each crossing portion between the upper selection gate line SGD and the columnar members 70. Also, the lower selection gate transistor STS is configured at each crossing portion between the lower selection gate line SGS and the columnar members 70. The memory cell trans MC is configured at each crossing portion between the word lines WL and the columnar members 70. Thereby, the multiple memory cell transistors MC are connected in series along each of the silicon pillars 80; and a NAND string is formed by the lower selection gate transistor STS and the upper selection gate transistor STD being connected to the two ends of the multiple memory cell transistors MC.

In the portion of the stacked body 60 interposed between two mutually-adjacent insulating members 23, an insulating member 69 that extends in the X-direction is provided in the Y-direction central portion of the upper portion and divides, into two in the Y-direction, the electrode films 22 that are used as the upper selection gate line SGD, i.e., the electrode films 22 that correspond to the terraces T71 to T73. The configuration of the insulating member 69 is a band configuration; and the insulating member 69 is made of, for example, silicon oxide. The insulating member 69 does not reach the electrode films 22 used as the word lines WL; accordingly, the electrode films 22 used as the word lines WL are not divided. Therefore, the two upper selection gate lines SGD that are arranged at the same height are disposed on one word line WL. In other words, the insulating member 69 is disposed between the two upper selection gate lines SGD arranged at the same height.

In the columnar member 70 as shown in FIG. 16 and FIG. 17, a core member 79, the silicon pillar 80, a tunneling insulating film 81, a charge storage film 82, and a silicon oxide layer 83 are provided from the central axis toward the perimeter surface. The core member 79 is made from silicon oxide; and the configuration of the core member 79 is a substantially circular column having the Z-direction as the axis direction. The core member 79 is disposed at a position including the central axis of the columnar member 70. The silicon pillar 80 is made of polysilicon; and the configuration of the silicon pillar 80 is a substantially circular tube extending in the Z-direction and having a plugged lower end. The tunneling insulating film 81 is provided at the periphery of the silicon pillar 80; the charge storage film 82 is provided at the periphery of the tunneling insulating film 81; and the silicon oxide layer 83 is provided at the periphery of the charge storage film 82. The configurations of the tunneling insulating film 81, the charge storage film 82, and the silicon oxide layer 83 are substantially circular tubes having the Z-direction as the axis direction.

Although the tunneling insulating film 81 normally is insulative, the tunneling insulating film 81 is a film in which a tunneling current flows when a prescribed voltage within the range of the drive voltage of the memory device 2 is applied and is, for example, an ONO film in which a silicon oxide, layer 81a, a silicon nitride layer 81b, and a silicon oxide layer 81c are stacked in this order. The charge storage film 82 is a film that can store charge, is made from, for example, a material having trap sites of electrons, and is made of, for example, silicon nitride.

On the other hand, an aluminum oxide layer 84 is provided on the surface of the electrode film 22. A blocking insulating film 85 includes the silicon oxide layer 83 and the aluminum oxide layer 84. The blocking insulating film 85 is a film in which a current substantially does not flow even when a voltage within the range of the drive voltage of the memory device 2 is applied. A memory film 86 is formed of the tunneling insulating film 81, the charge storage film 82, and the blocking insulating film 85. For example, the average nitrogen concentration of the charge storage film 82 is higher than the average nitrogen concentration of the tunneling insulating film 81 and the average nitrogen concentration of the blocking insulating film 85.

In the electrode film 22, a main portion 88 that is made of tungsten (W) is provided; and a barrier metal layer 89 in which a titanium (Ti) layer and a titanium nitride (TiN) layer are stacked is provided on the surface of the main portion 88. The main portion 88 contacts the insulating member 23 (referring to FIG. 15). The region of the surface of the main portion 88 other than the region contacting the insulating member 23 contacts the barrier metal layer 89. The barrier metal layer 89 contacts the aluminum oxide layer 84.

A method for manufacturing the memory device according to the embodiment will now be described.

FIG. 18 to FIG. 22 are cross-sectional views showing the method for manufacturing the memory device according to the embodiment.

Figure 23:
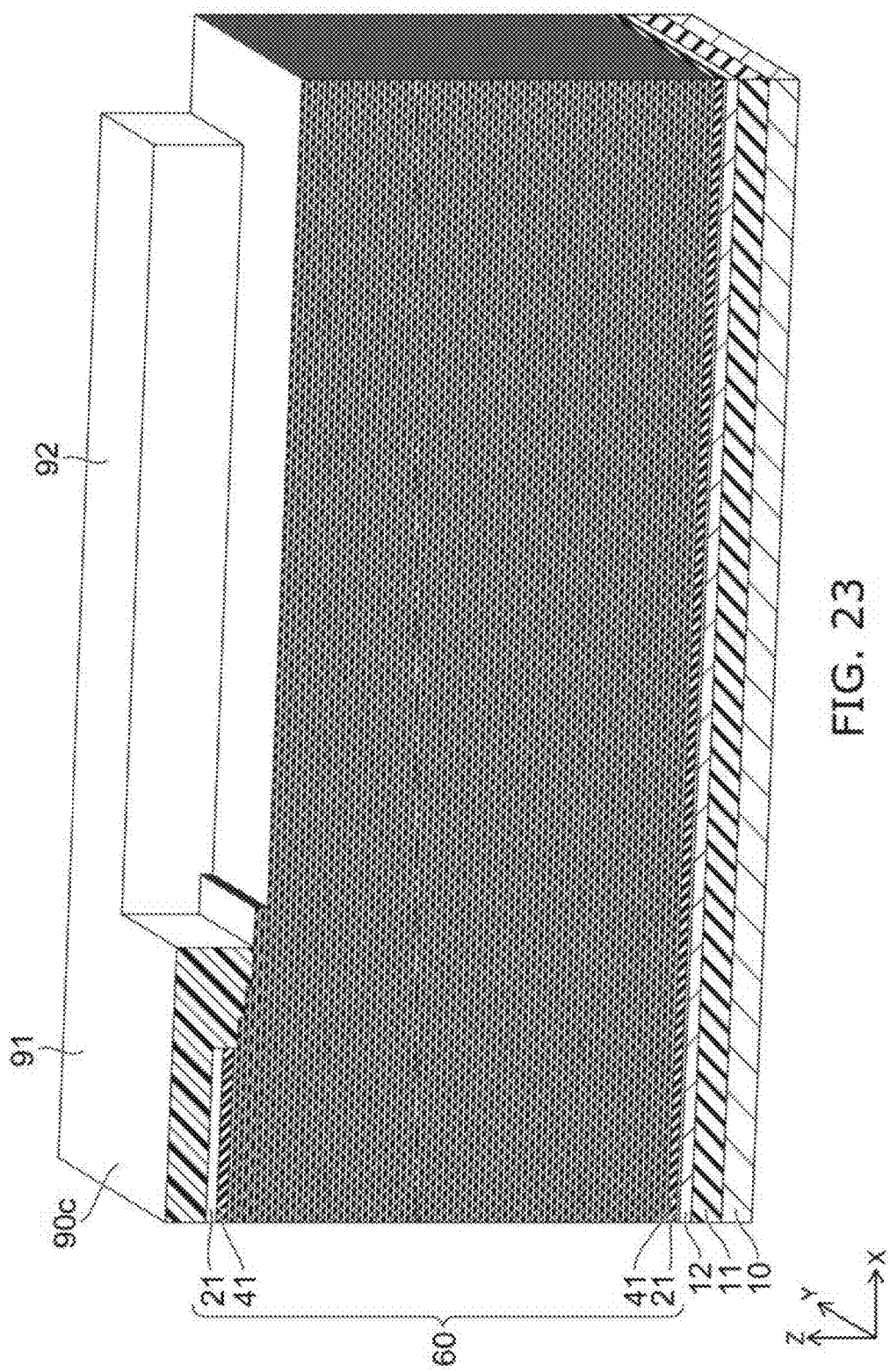
FIG. 23 and FIG. 24 are perspective views showing the method for manufacturing the memory device according to the second embodiment.
Figure 24:
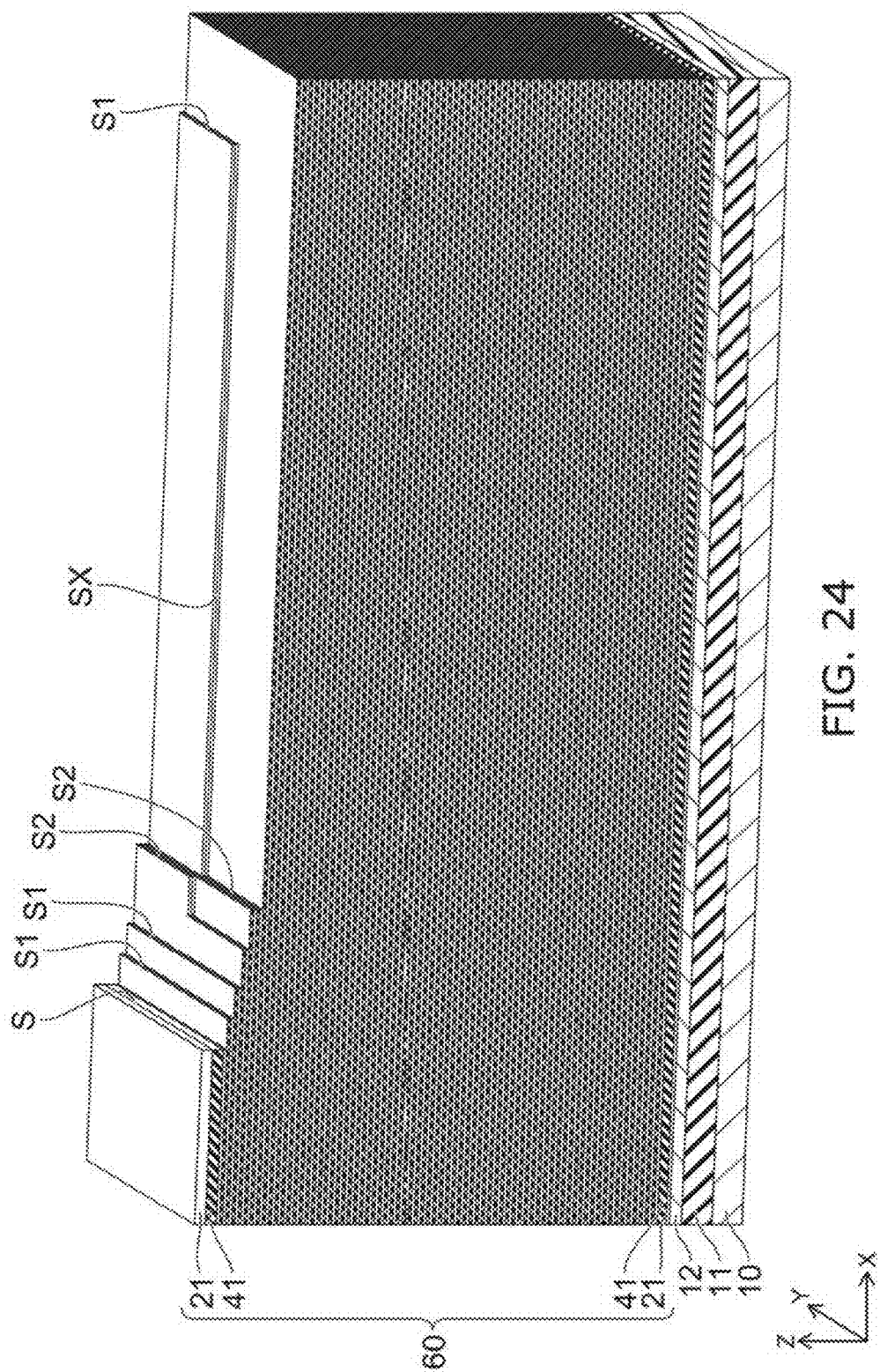

FIG. 23 and FIG. 24 are perspective views showing the method for manufacturing the memory device according to the embodiment.

FIG. 25 to FIG. 36 are cross-sectional views showing the method for manufacturing the memory device according to the embodiment.

Figure 18:
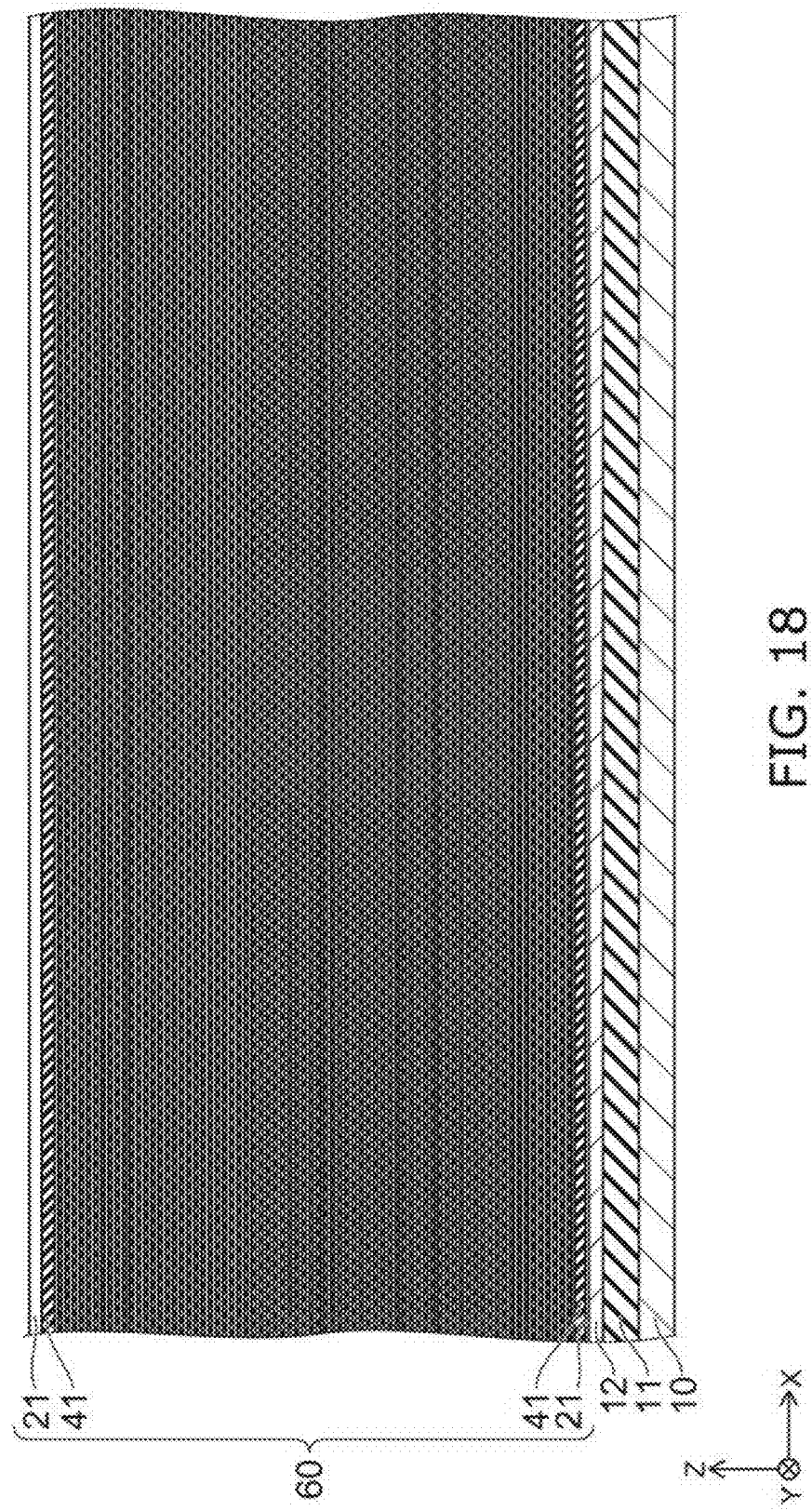
FIG. 18 to FIG. 22 are cross-sectional views showing a method for manufacturing the memory device according to the second embodiment.

As shown in FIG. 18, first, the insulating film formed on the silicon substrate 10. At this time, a drive circuit (not illustrated) is formed inside the insulating film 11 and the upper layer portion of the silicon substrate 10. Then, the conductive film 12 is formed on the insulating film 11 by depositing, for example, a metal material and polysilicon.

Then, the stacked body 60 is formed by alternately stacking the insulating films 21 and the sacrificial films 41 on the conductive film 12. For example, the insulating films 21 are formed of silicon oxide; and the sacrificial films 41 are formed of silicon nitride. For example, seventy-four layers of the sacrificial films 41 are formed.

Figure 19:
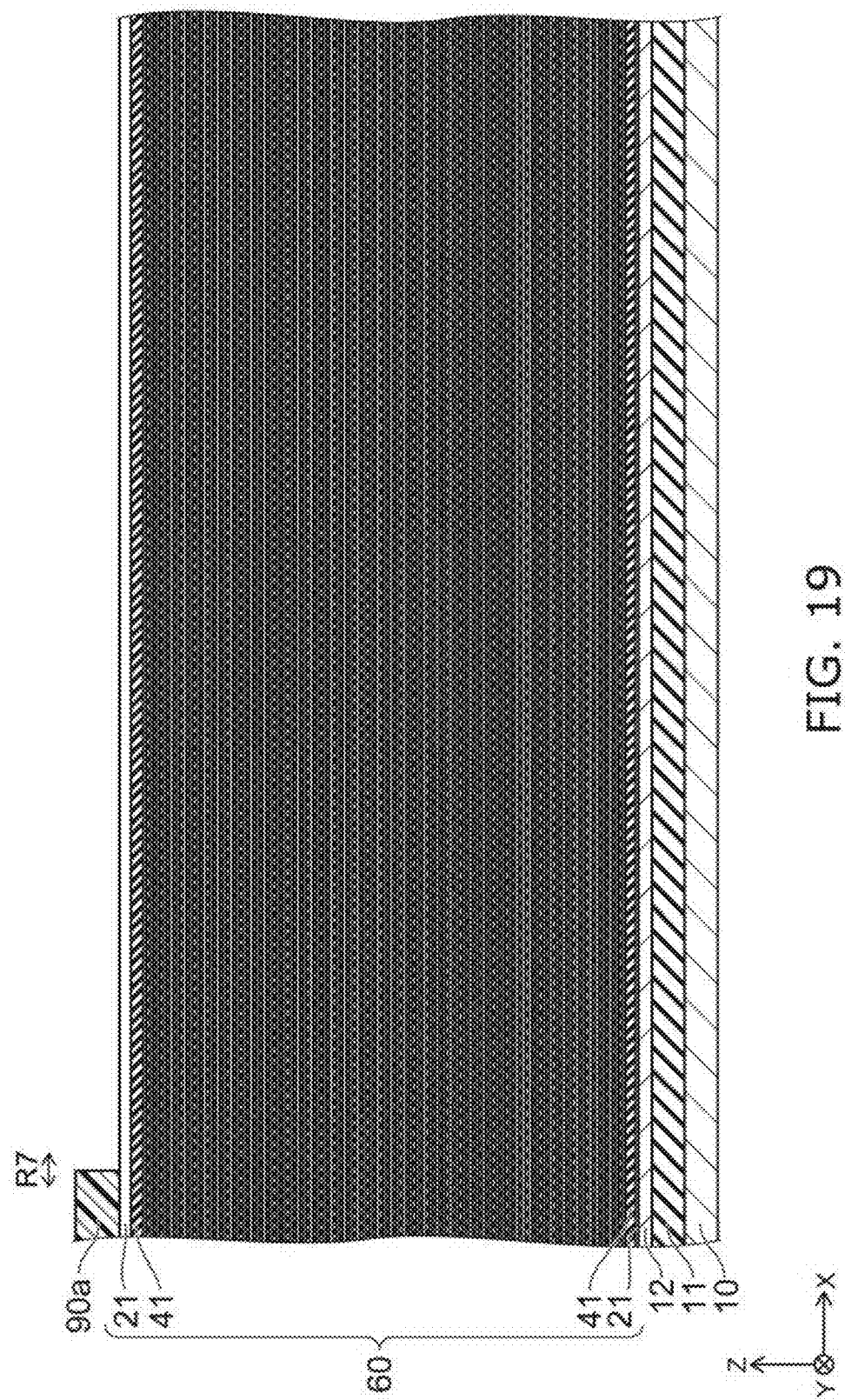

Then, as shown in FIG. 19, a resist pattern 90a is formed on the stacked body 60. The configuration of the resist pattern 90a is a rectangle having four side surfaces having straight line configurations facing the X-direction and the Y-direction when viewed from the Z-direction. The shape difference D of the resist pattern 90a (referring to FIG. 3) is substantially zero.

Figure 20:
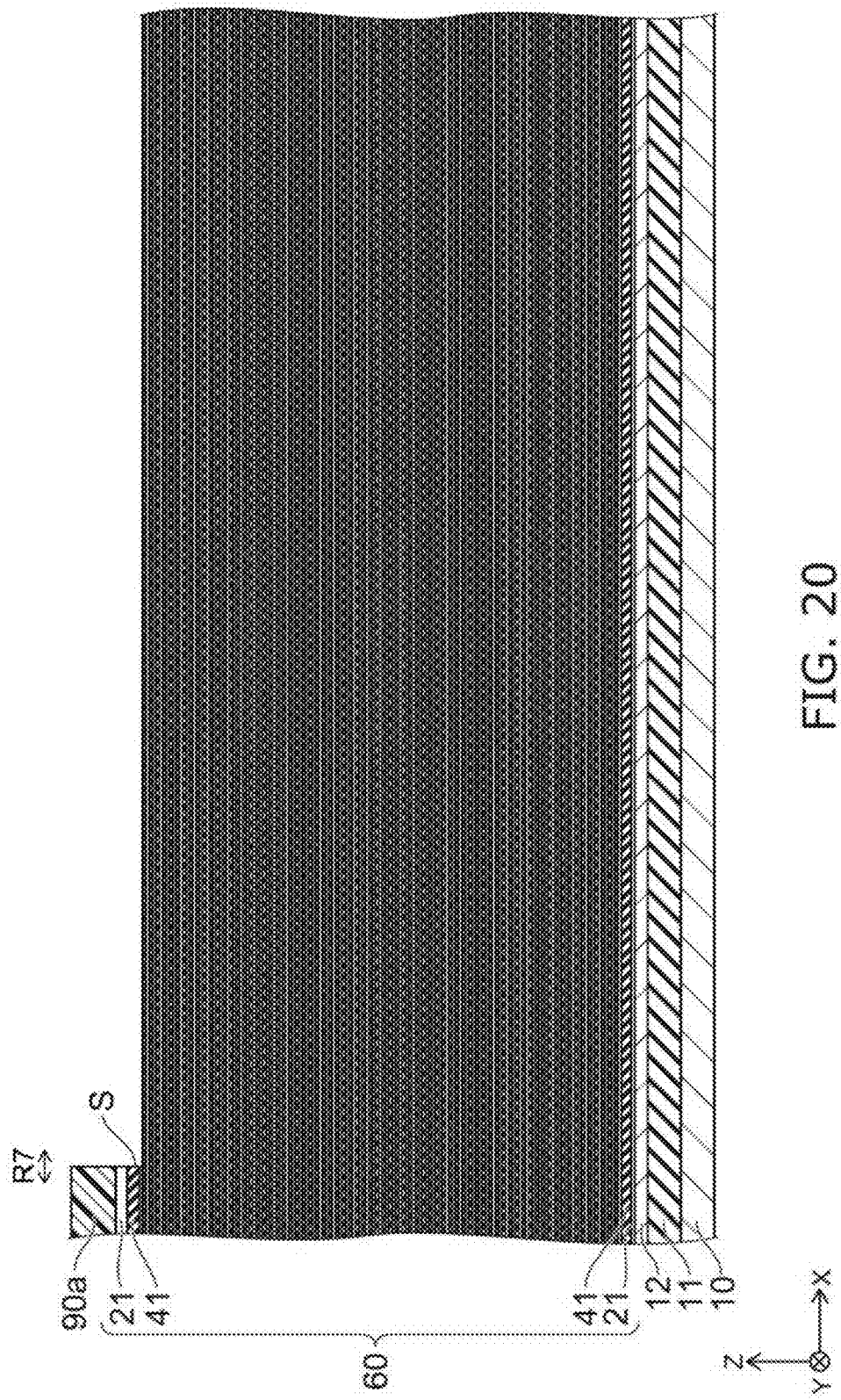

Then, as shown in FIG. 20, etching such as RIE or the like is performed using the resist pattern 90a as a mask; and two insulating films 21 and one sacrificial film 41 are selectively removed in order from the upper layer side of the stacked body 60. Thereby, one step S that extends in the Y-direction is formed in the region R7. Then, the resist pattern 90a is removed.

Figure 21:
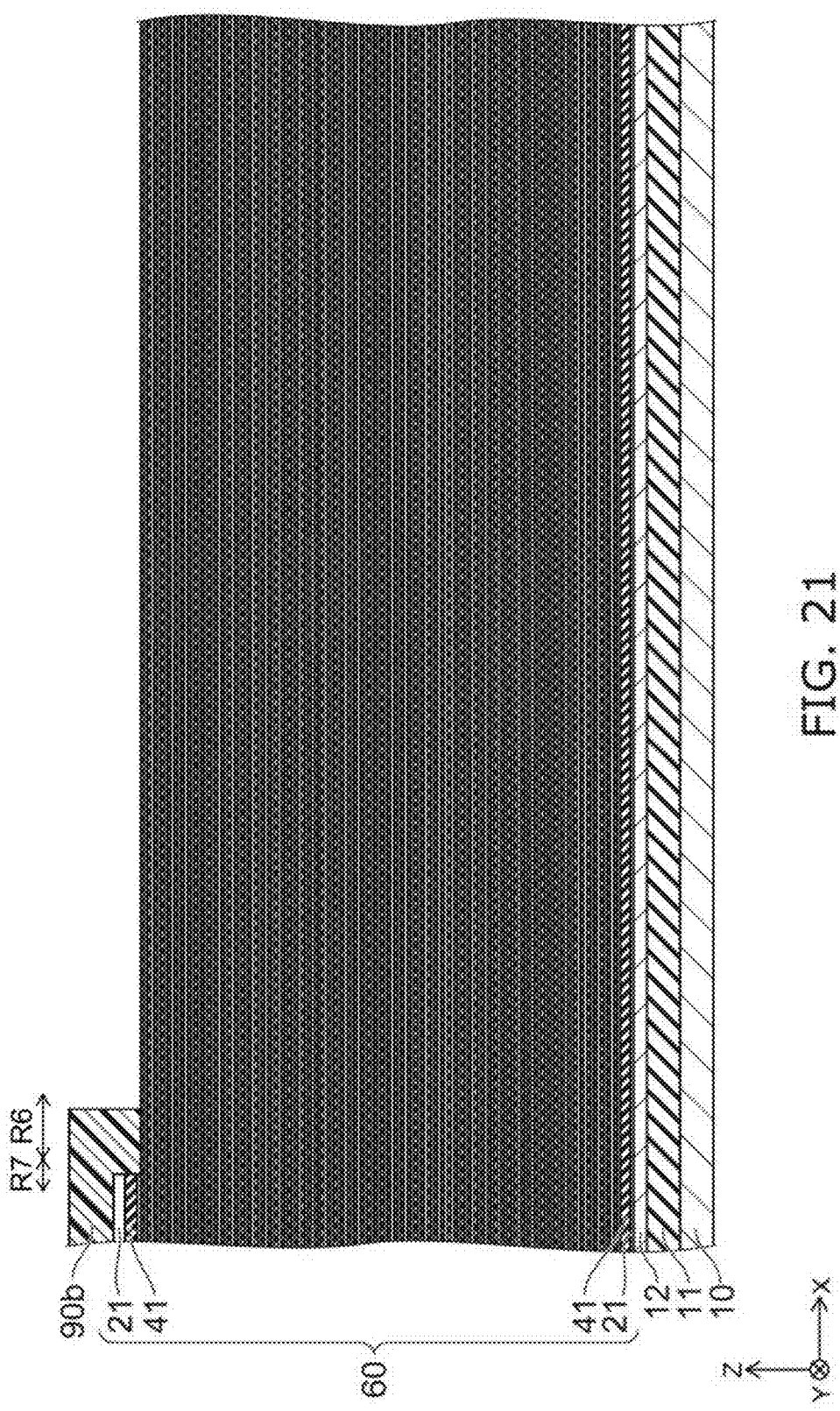

Then, as shown in FIG. 21, a resist pattern 90b is formed on the stacked body 60. The configuration of the resist pattern 90b is a quadrilateral in which the four side surfaces facing the X-direction and the Y-direction each is curved to be concave when viewed from the Z-direction, and the corners are acute. Hereinbelow, such a configuration is called an "acute quadrilateral." The shape difference D of the side surface facing the X-direction of the resist pattern 90b (referring to FIG. 3) is greater than zero.

Figure 22:
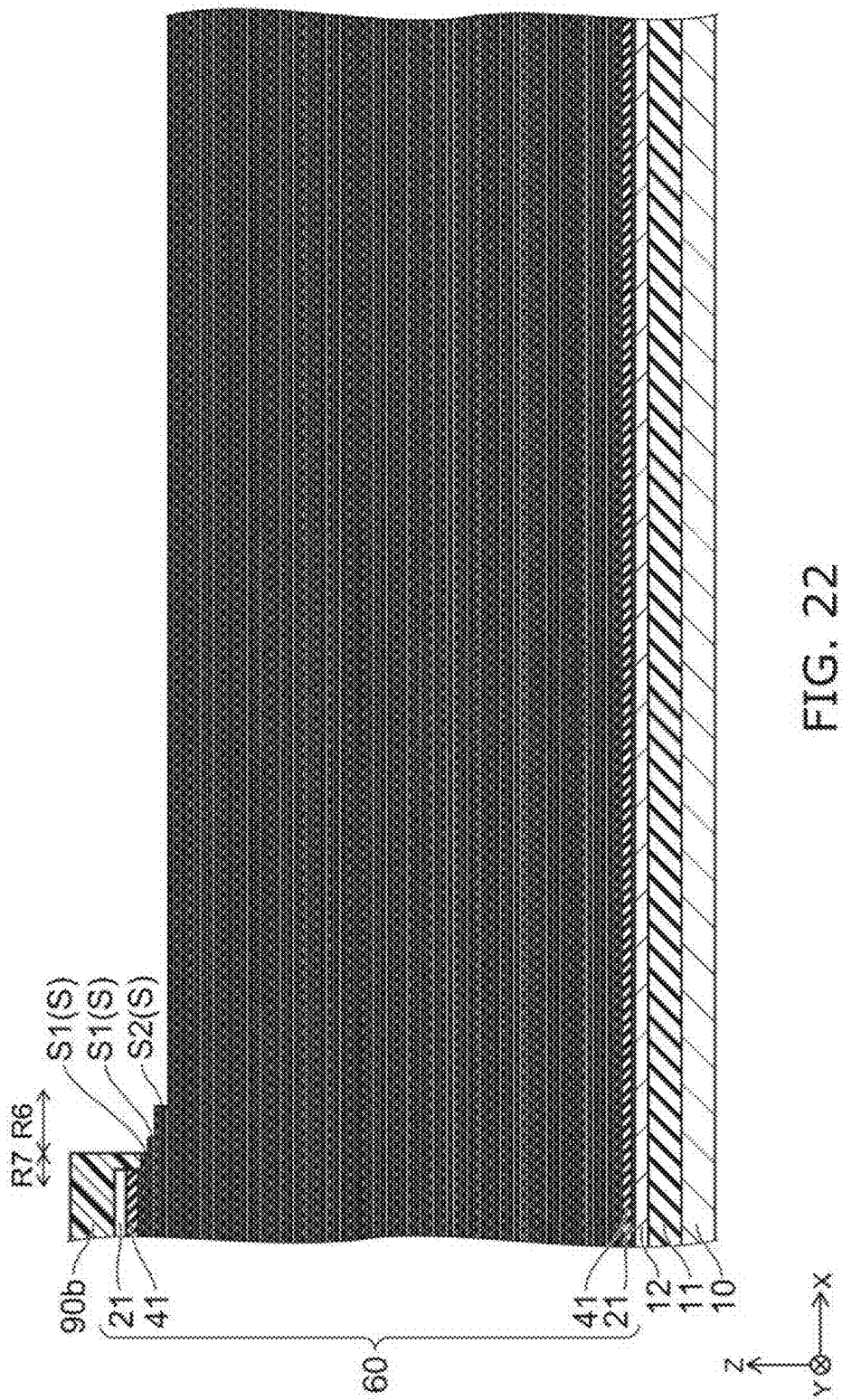

Then, as shown in FIG. 22, etching such as RIE or the like is performed using the resist pattern 90b as a mask. Thereby, at the portion of the stacked body 60 not covered with the resist pattern 90b, two sacrificial films 41 and two insulating films 21 are removed; and one step S that extends in the Y-direction is formed. This step includes the side surfaces of the two sacrificial films 41. Hereinbelow, such a step also is called a "two-level step S2."

Then, slimming is performed by ashing the resist pattern 90b. Thereby, the side surface of the resist pattern 90b recedes. At this time, the shape difference D decreases because the recessed amounts of the corners of the resist pattern 90b are larger than the recessed amount of the central portion of the side surface. On the other hand, the error E occurs as the slimming is performed.

Then, etching such as RIE or the like is performed using, as a mask, the resist pattern 90b after the slimming. Thereby, at the portion of the stacked body 60 not covered with the resist pattern 90b, one sacrificial film 41 and one insulating film 21 are removed; and one step S that extends in the Y-direction is formed. This step S includes the side surface of one sacrificial film 41. Hereinbelow, such a step also is called a "one-level step S1."

Then, further slimming of the resist pattern 90b is performed. At this time, the shape difference D decreases due to the rounding of the corners of the resist pattern 90b. On the other hand, the error E increases by accumulating. Subsequently, etching is performed using the resist pattern 90b as a mask. Thereby, a one-level step S1 is formed in the stacked body 60. Thus, a total of three steps S, i.e., one two-level step S2 and two one-level steps S1, are formed in the region R6 using one resist pattern 90b. Then, the resist pattern 90b is removed.

Then, as shown in FIG. 23, a resist pattern 90c is formed on the stacked body 60. The configuration of the resist pattern 90c is a comb-shaped configuration. Namely, multiple teeth 92 that extend in the X-direction extend from a main portion 91 extending in the Y-direction. Each of the teeth 92 covers one Y-direction side of the portion of the stacked body 60 interposed between the insulating members 23.

Then, as shown in FIG. 24, etching is performed using the resist pattern 90c (referring to FIG. 23) as a mask. Thereby, one sacrificial film 41 and one insulating film 21 are removed in the region of the stacked body 60 not covered with the resist pattern 90c. As a result, the one-level step S1 that extends in the Y-direction and the one-level step S that extends in the X-direction are formed in the stacked body 60. Hereinbelow, the one-level step S that extends in the X-direction also is called a "step SX." The step SX extends from the X-direction central portion of the region R6 to the region R2 (referring to FIG. 31). Then, the resist pattern 90c (referring to FIG. 23) is removed.

Figure 25:
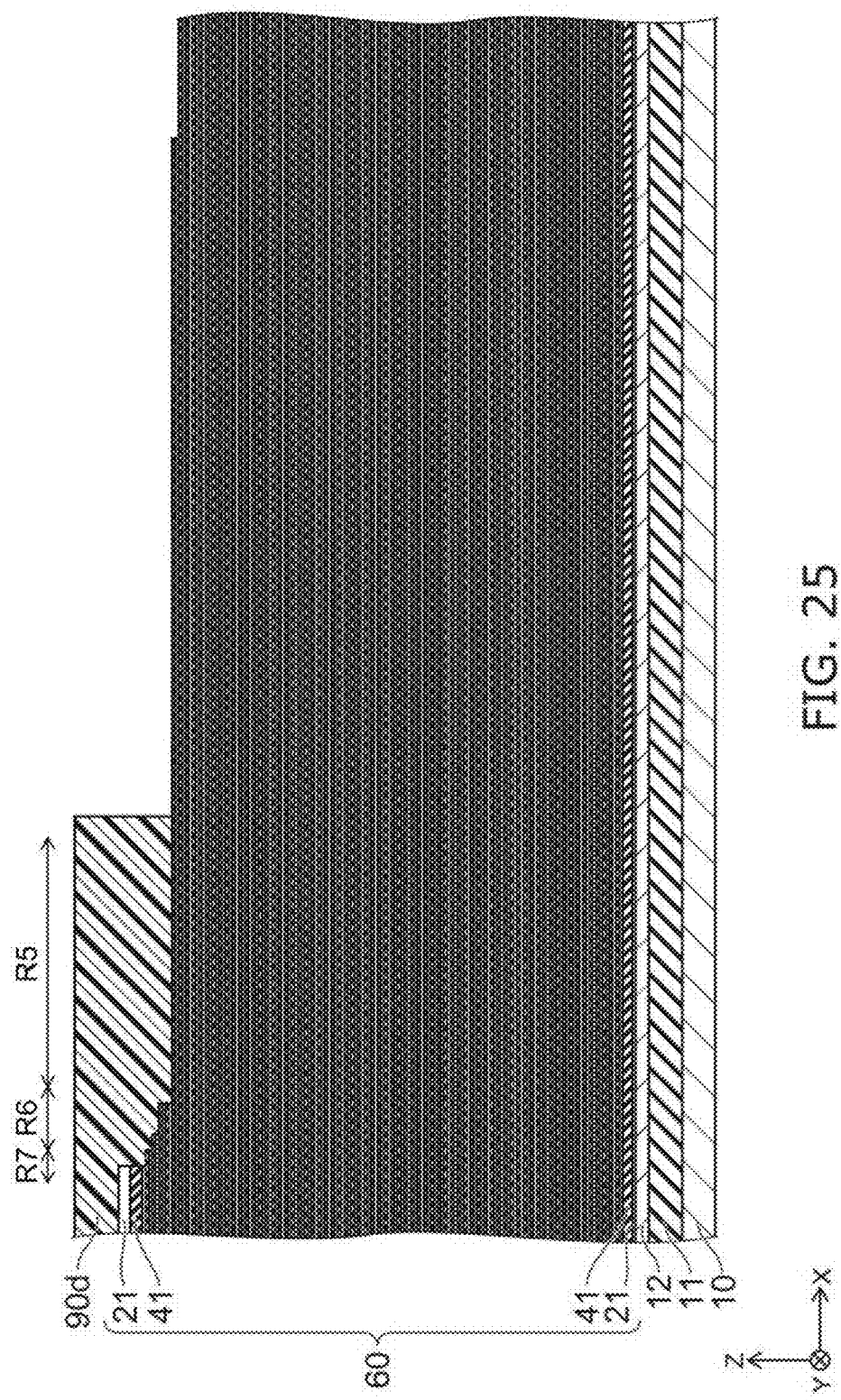
FIG. 25 to FIG. 36 are cross-sectional views showing the method for manufacturing the memory device according to the second embodiment.

Then, as shown in FIG. 25, a resist pattern 90d is formed on the stacked body 60. The configuration of the resist pattern 90d is an acute quadrilateral. The shape difference D of the side surface facing the X-direction of the resist pattern 90d (referring to FIG. 3) is greater than zero.

Figure 26:
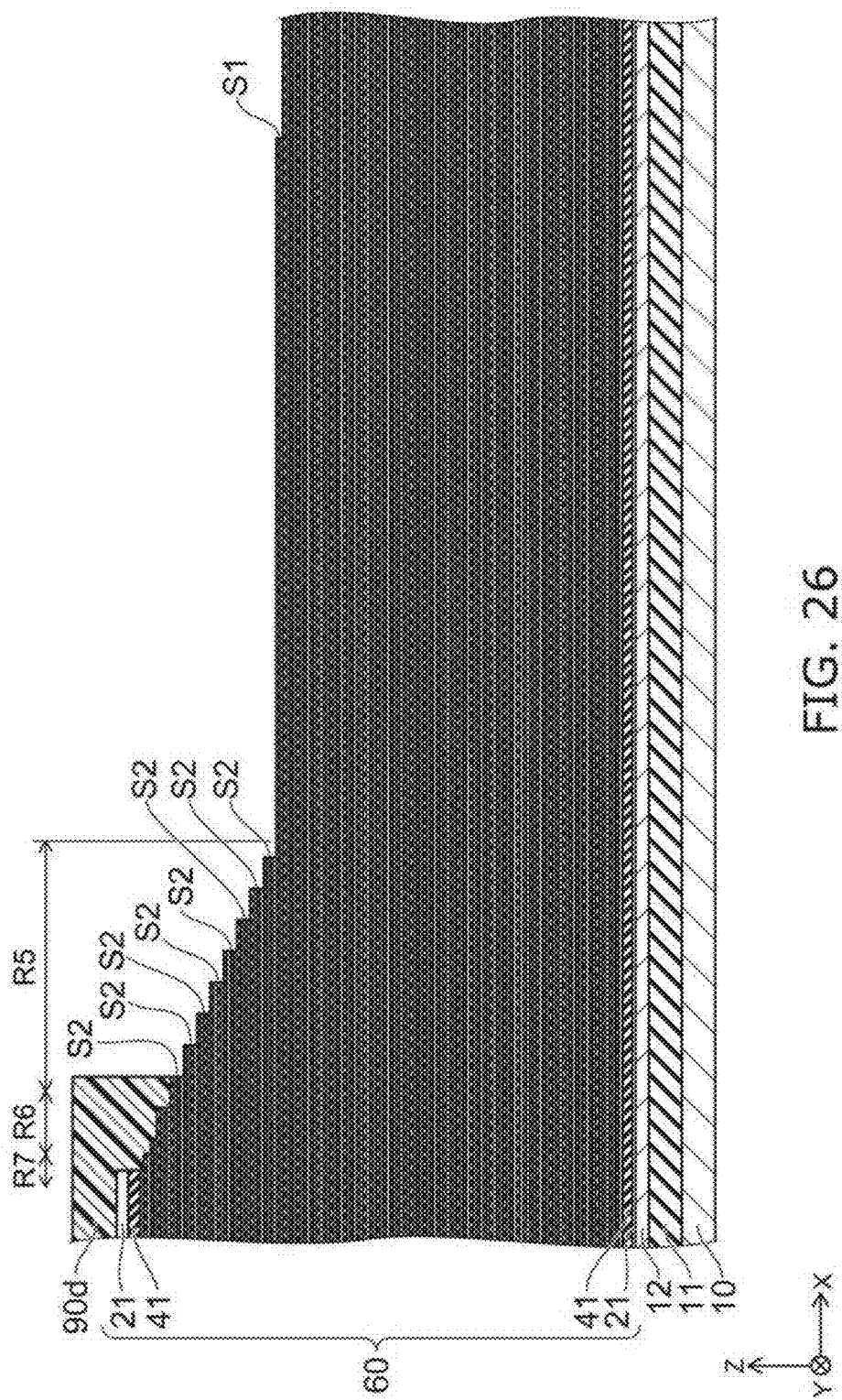

Then, as shown in FIG. 26, etching using the resist pattern 90d as a mask and slimming of the resist pattern 90d are repeated alternately. At this time, the etching is implemented eight times; and the slimming is implemented seven times. In each etching, two sacrificial films 41 and two insulating films 21 are removed. Thereby, eight two-level steps S2 are formed in the region R5. At this time, as the slimming is repeated, the shape difference D of the resist pattern 90d decreases; and the error E increases. Also, the step SX that extends in the X-direction is transferred to the lower levels. Then, the resist pattern 90d is removed.

Figure 27:
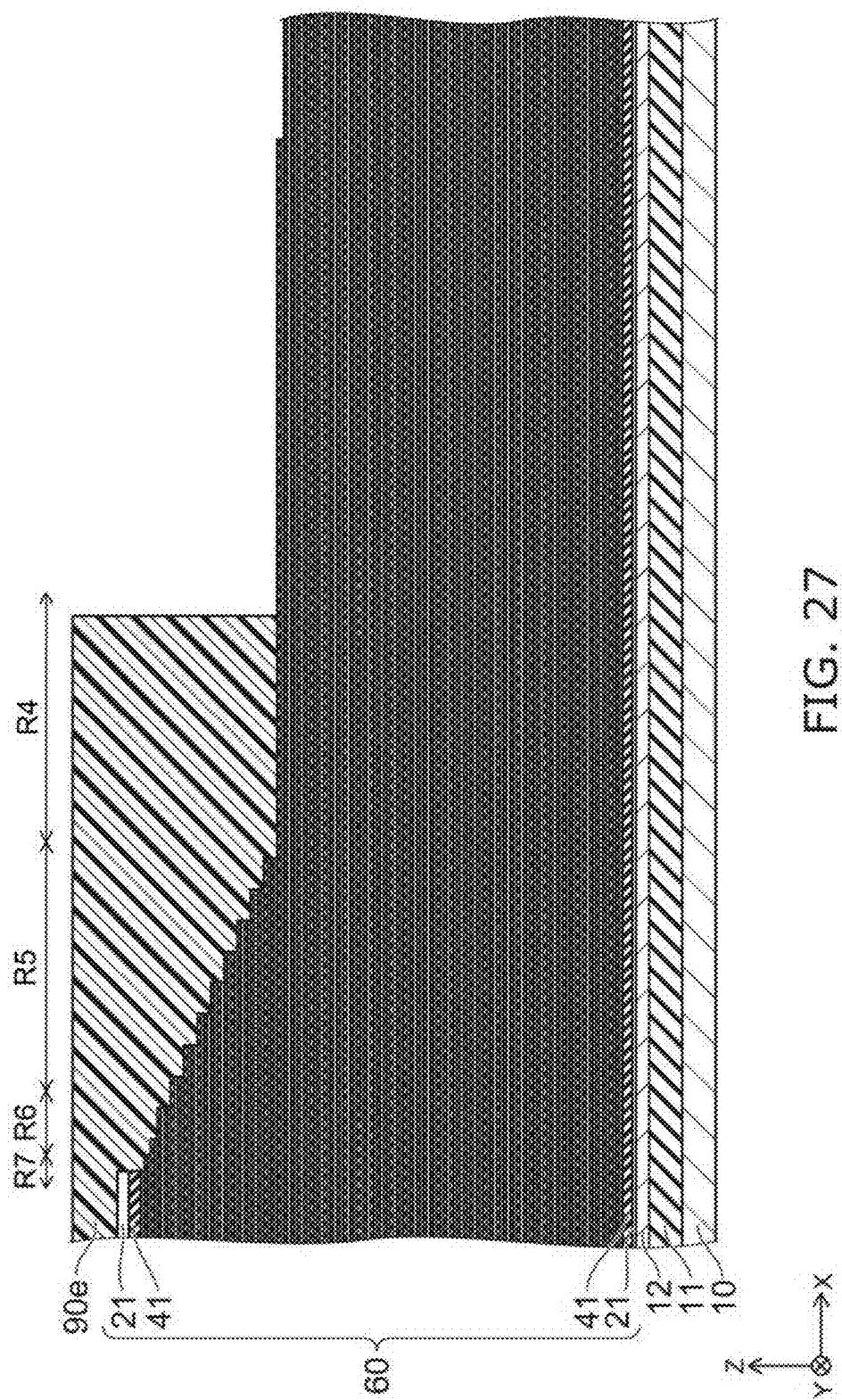

Then, as shown in FIG. 27, a resist pattern 90e is formed on the stacked body 60. Similarly to the resist pattern 90d, the configuration of the resist pattern 90e also is set to be an acute quadrilateral.

Figure 28:
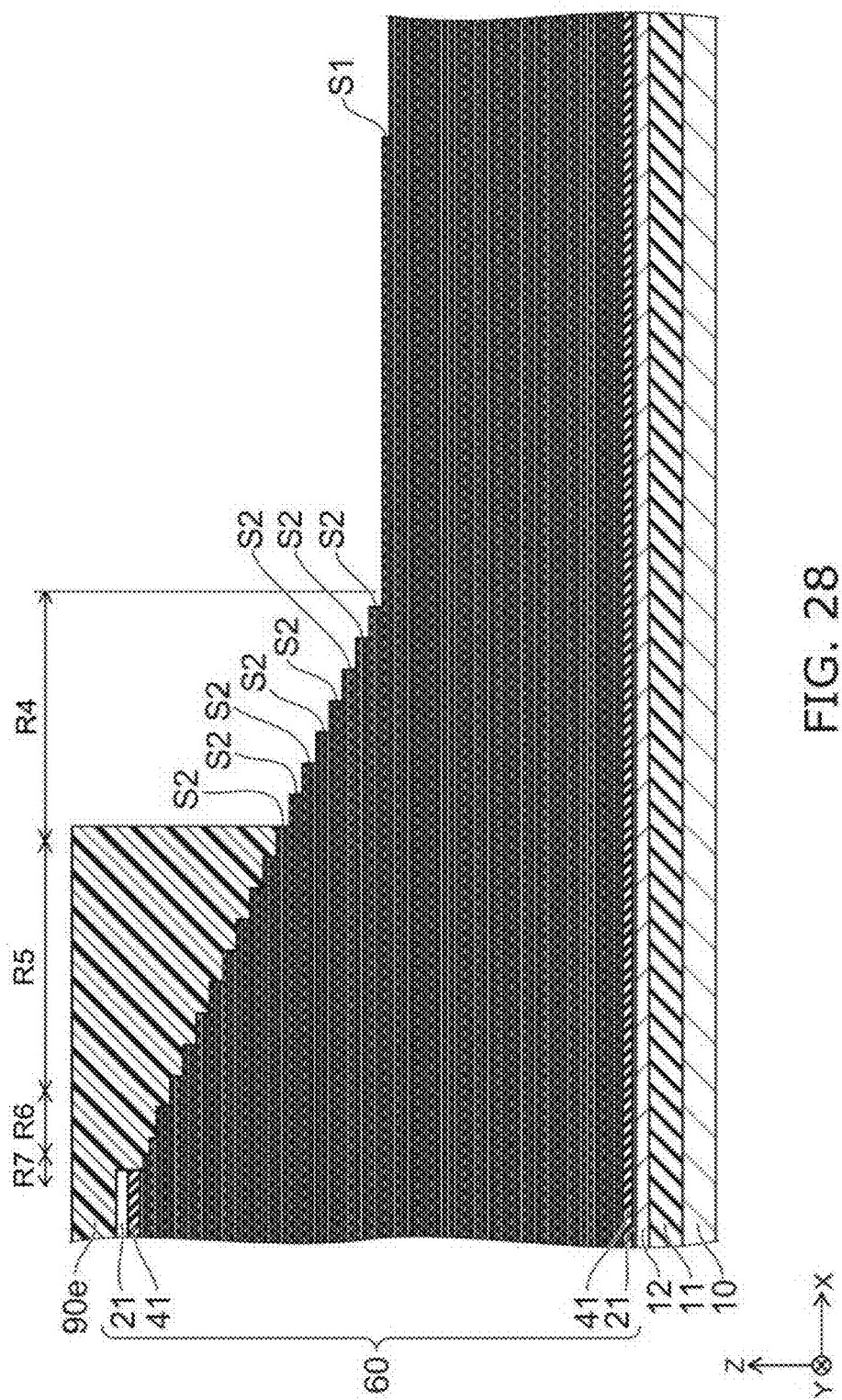

Then, as shown in FIG. 28, etching using the resist pattern 90e as a mask and slimming of the resist pattern 90e are repeated alternately. At this time, the etching is implemented eight times; and the slimming is implemented seven times. Two sacrificial films 41 and two insulating films 21 are removed in each etching. Thereby, eight two-level steps S2 are formed in the region R4. As the slimming is repeated, the shape difference D of the resist pattern 90e decreases; and the error E increases. Also, the step SX that extends in the X-direction is transferred to the lower levels. Then, the resist pattern 90e is removed.

Figure 29:
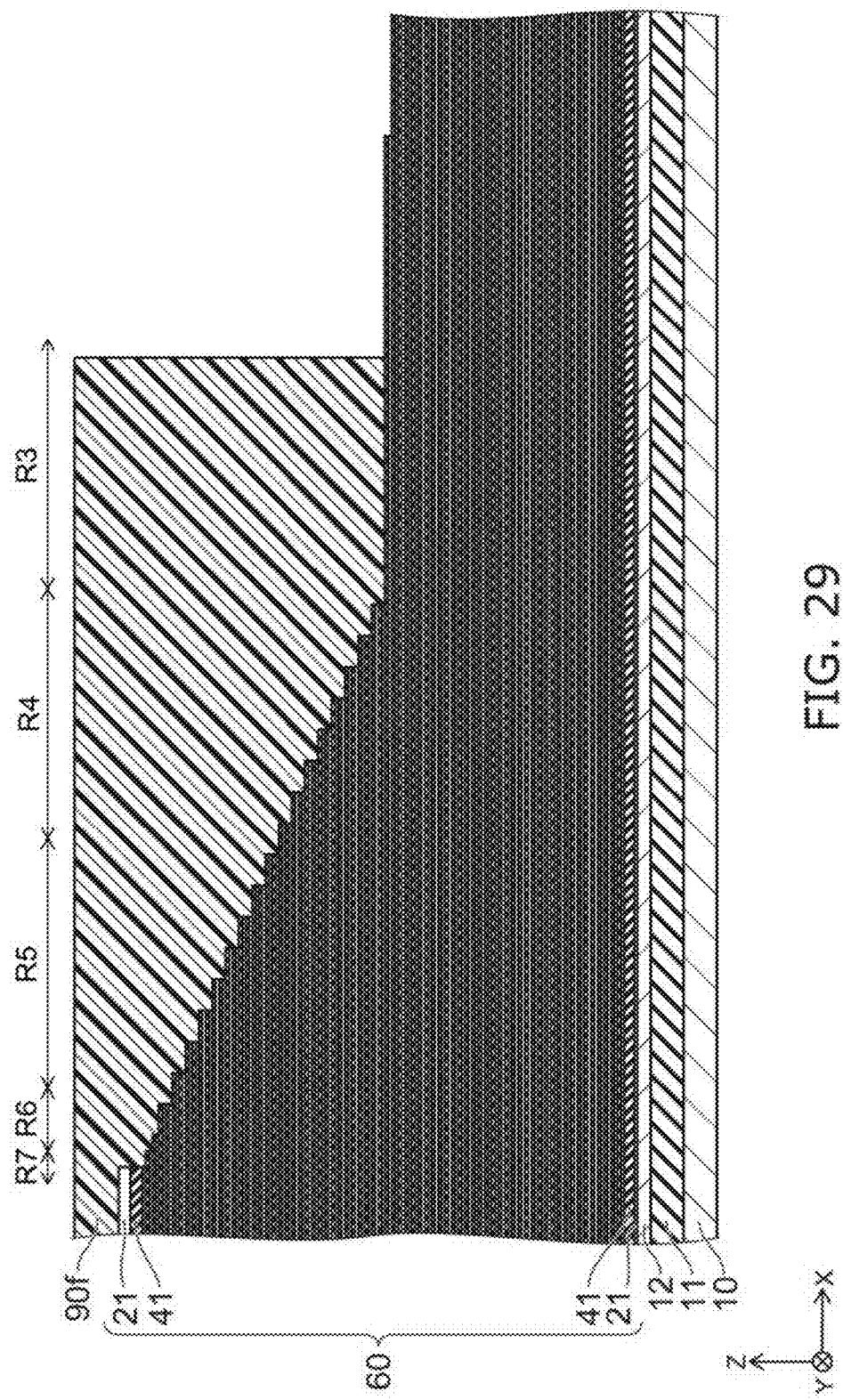

Then, as shown in FIG. 29, a resist pattern 90f is formed on the stacked body 60. Similarly to the resist pattern 90d, the configuration of the resist pattern 90f also is set to be an acute quadrilateral.

Figure 30:
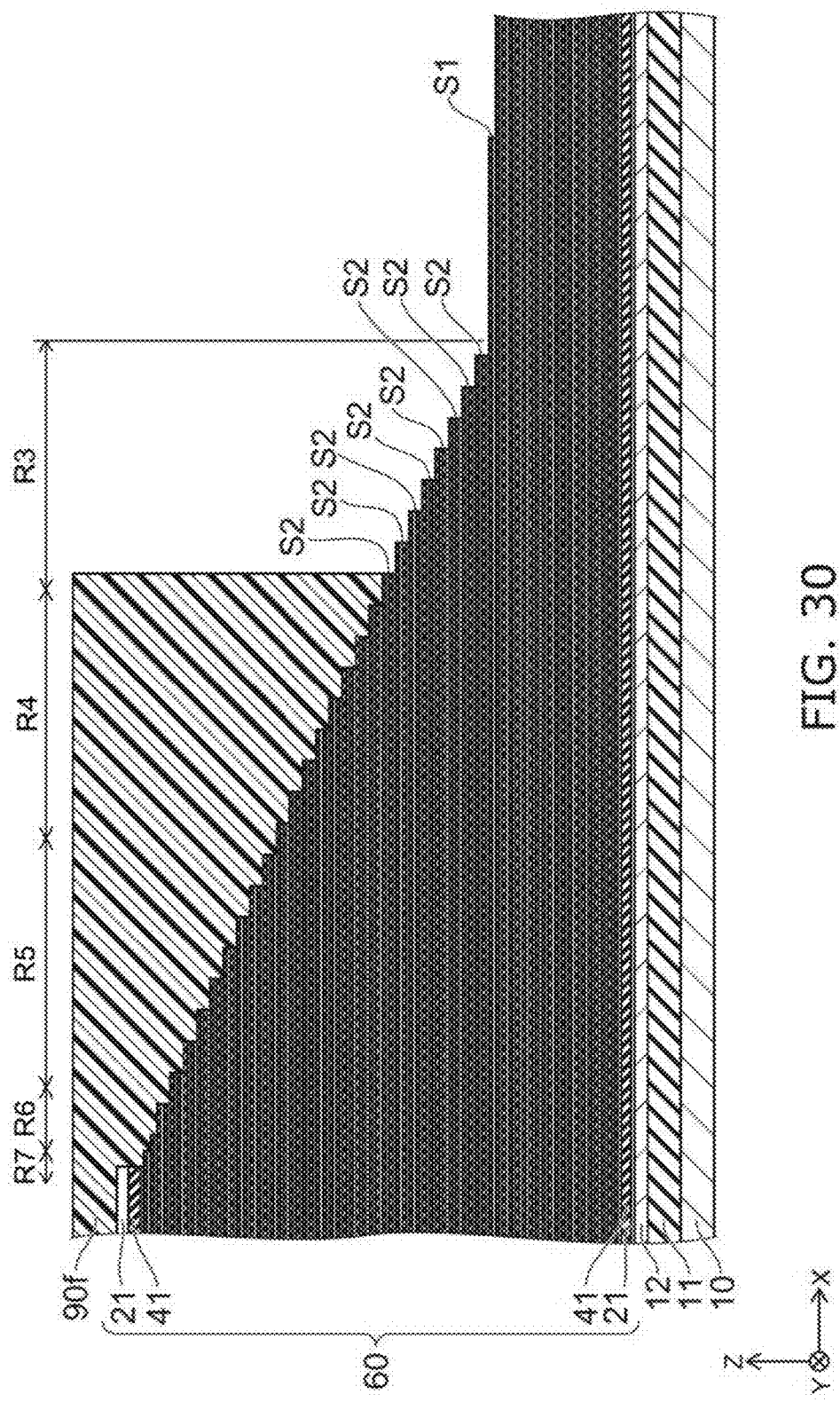

Then, as shown in FIG. 30, etching using the resist pattern 90f as mask and slimming of the resist pattern 90f are repeated alternately. At this time, the etching is implemented eight times; and the slimming is implemented seven times. Two sacrificial films 41 and two insulating films 21 are removed in each etching. Thereby, eight two-level steps S2 are formed in the region R3. As the slimming is repeated, the shape difference D of the resist pattern 90f decreases; and the error E increases. Also, the step SX that extends in the X-direction is transferred to the lower levels. Then, the resist pattern 90f is removed.

Figure 31:
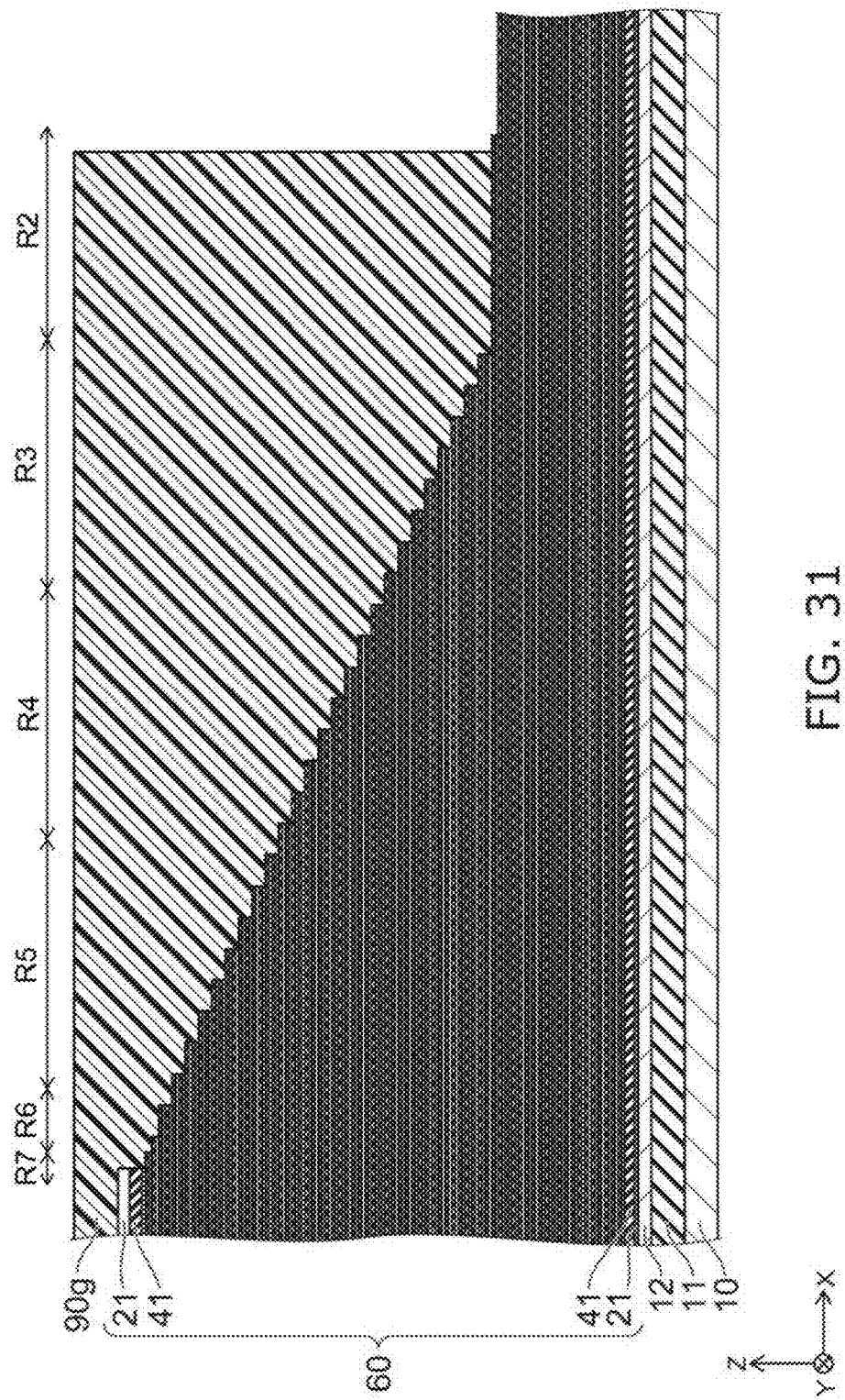

Then, as shown in FIG. 31, a resist pattern 90g is formed on the stacked body 60. Similarly to the resist pattern 90d, the configuration of the resist pattern 90g also is set to be an acute quadrilateral. However, the shape difference D of the initial configuration of the resist pattern 90g is smaller than the shape difference D of the initial configuration of the resist pattern 90d.

Figure 32:
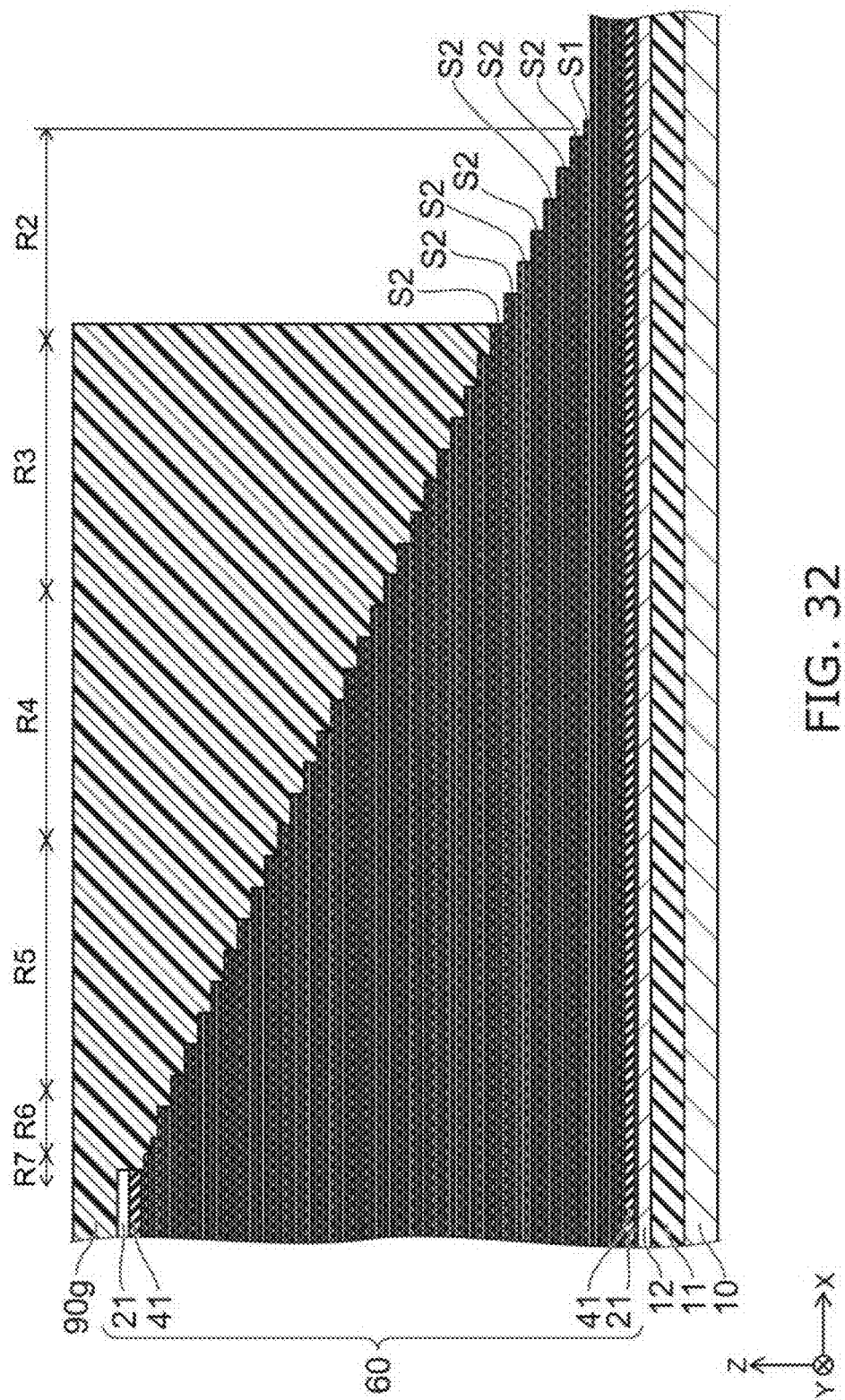

Then, as shown ire FIG. 32, etching using the resist pattern 90g as a mask and slimming of the resist pattern 90g are repeated alternately. At this time, the etching is implemented seven times and the slimming is implemented six times. Two sacrificial films 41 and two insulating films 21 are removed in each etching. Thereby, seven two-level steps S2 are formed in the region R2. As the slimming is repeated, the shape difference D of the resist pattern 90g decreases:, and the error E increases. Also, the step SX that extends in the X-direction is transferred to the lower levels. Then, the resist pattern 90g is removed.

Figure 33:
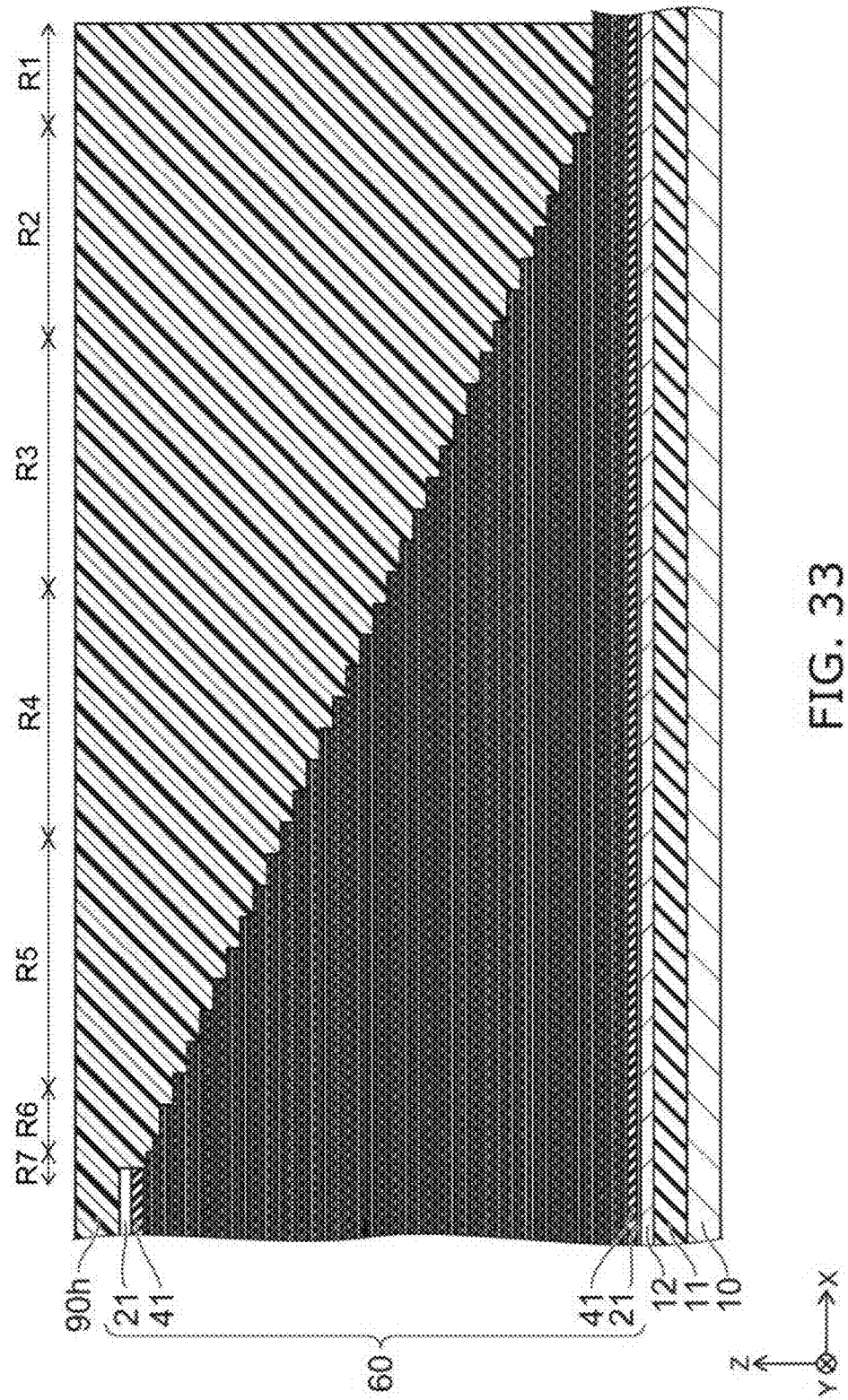

Then, as shown in FIG. 33, a resist pattern 90h is forced on the stacked body 60. The configuration of the resist pattern 90h also is set to be an acute quadrilateral. However, the shape difference D of the initial configuration of the resist pattern 90h is smaller than the shape difference D of the initial configuration of the resist pattern 90g.

Figure 34:
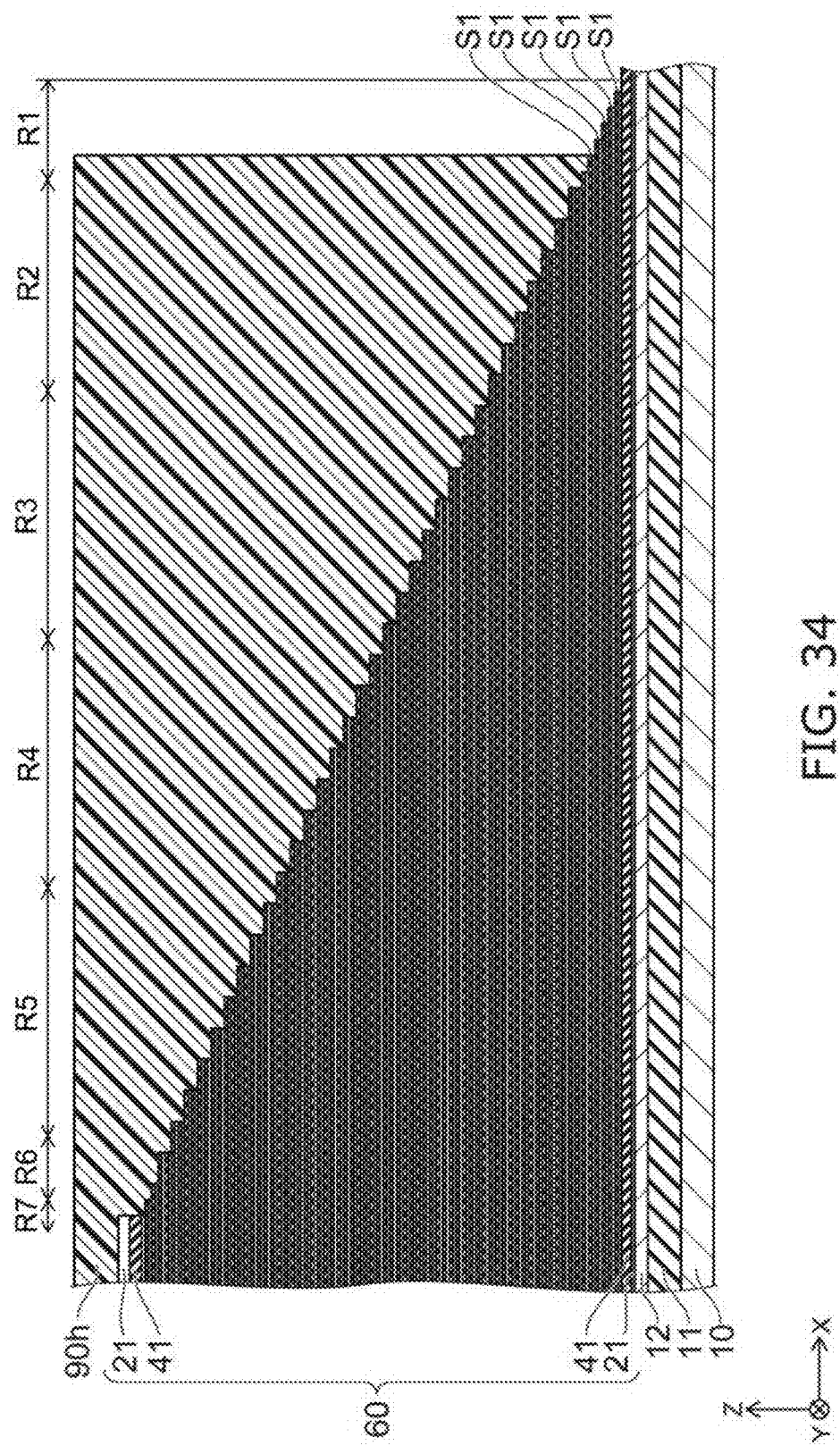

Then, as shown in FIG. 34, etching using the resist pattern 90h as a mask and slimming of the resist pattern 90h are repeated alternately. At this time, the etching is implemented five times; and the slimming is implemented four times. One sacrificial film 41 and one insulating film 21 are removed in each etching. Thereby, five one-level steps S1 are formed in the region R1. As the slimming is repeated, the shape difference D of the resist pattern 90h decreases; and the error E increases. Also, the step SX that extends in the X-direction is not formed in the region R1. Then, the resist pattern 90h is removed.

Figure 35:
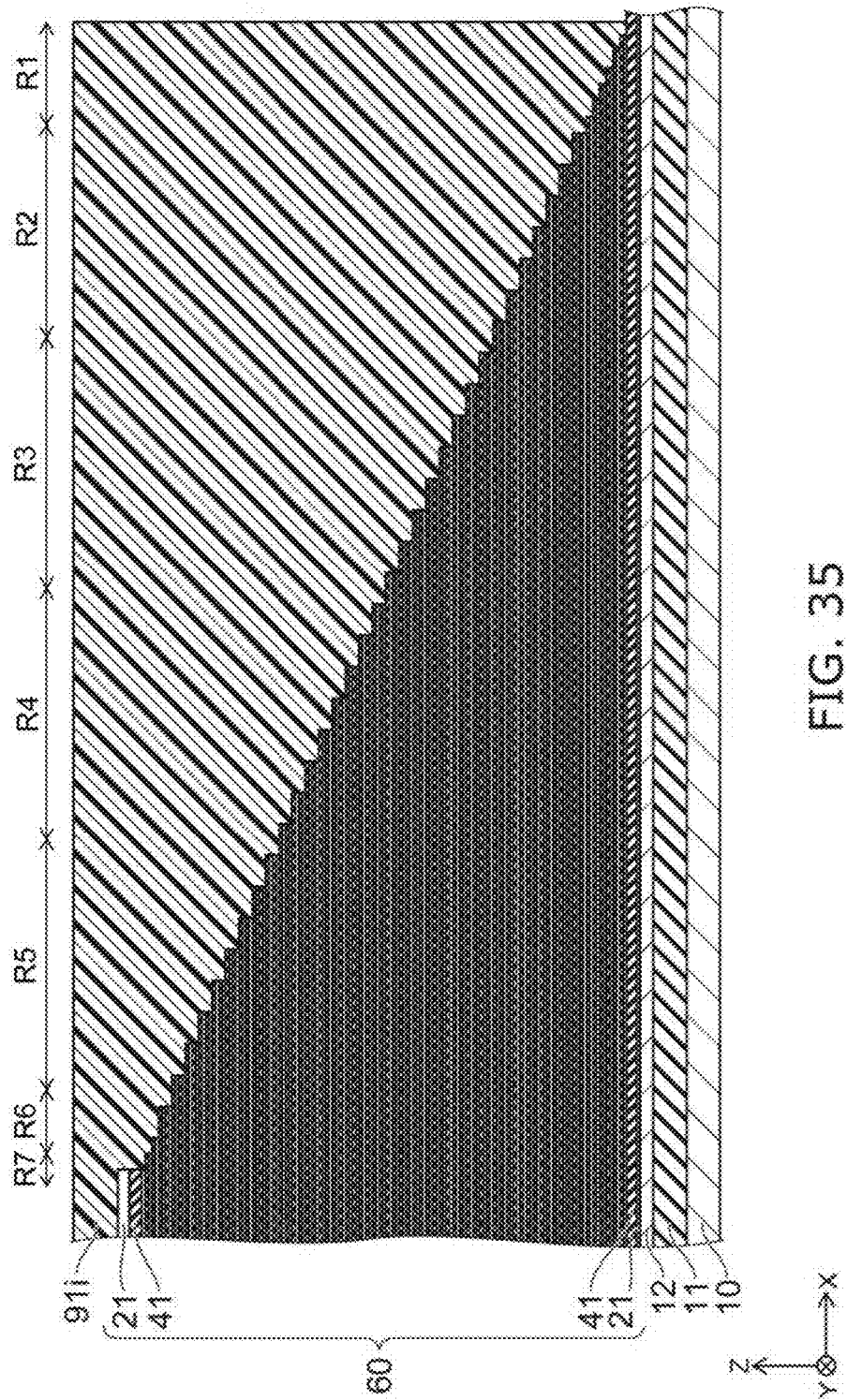

Then, as shown in FIG. 35, a resist pattern 90i is formed on the stacked body 60. The configuration of the resist pattern 90i is set to be a rectangle having four side surfaces having straight line configurations facing the X-direction and the Y-direction when viewed from the Z-direction. The shape difference D of the resist pattern 90i (referring to FIG. 3) is substantially zero.

Figure 36:
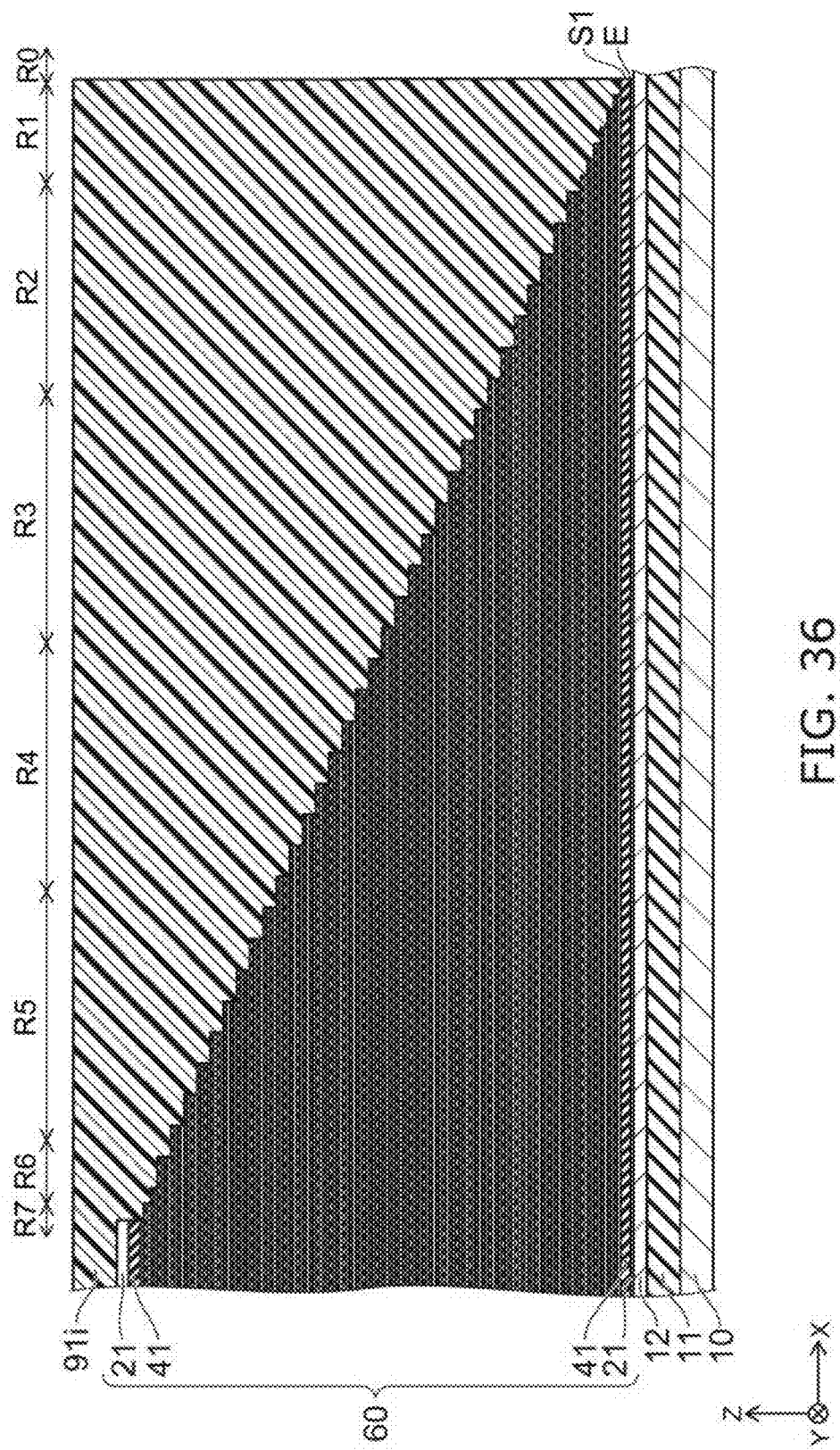

Then, as shown in FIG. 36, etching is performed using the resist pattern 90i as a mask; and one sacrificial film 41 and one insulating film 21 are selectively removed. Thereby, the sacrificial film 41 of the lowermost layer is patterned; and one one-level step S1 that extends in the Y-direction is formed in the region R0. The bottom line of the one-level step S1 of the lowermost level is the end edge E of the stacked body 60. Then, the resist pattern 90i is removed.

Then, as shown in FIG. 12 to FIG. 14, trenches 93 that extend in the X-direction are formed in the upper portion of the stacked body 60 by, for example, lithography. The trenches 93 are multiply formed and are arranged periodically in the Y-direction. The trenches 93 divide the sacrificial films 41 to be replaced with the upper selection gate lines SGD in a subsequent process, but do not divide the sacrificial films 41 to be replaced with the word lines WL (referring to FIG. 3) or with the lower selection gate lines SGS in a subsequent process. Then, the insulating members 69 are formed by filling silicon oxide into the trenches 93.

Then, as shown in FIG. 15 to FIG. 17, a resist mask (not illustrated) is formed on the stacked body 60 by lithography; and anisotropic etching such as RIE or the like is performed using the resist mask as a mask. Thereby, memory holes 95 are formed in the stacked body 60. The configurations of the memory holes 95 are substantially circular columns extending in the Z-direction. The conductive film 12 is exposed at the bottom surfaces of the memory holes 95.

Then, the silicon oxide layer 83 is formed on the inner surfaces of the memory holes 95. Then, the charge storage film 82 is formed by depositing silicon nitride. Then, the tunneling insulating film 81 is formed by forming the silicon oxide layer 81c, the silicon nitride layer 81b, and the silicon oxide layer 81a by depositing silicon oxide silicon nitride, and silicon oxide in this order.

Then, a cover silicon layer (not illustrated) is formed by depositing silicon. Then, the cover silicon layer, the tunneling insulating film 81, the charge storage film 82, and the silicon oxide layer 83 that are on the bottom surfaces of the memory holes 95 are removed by performing RIE. Then, a body silicon layer is formed by depositing silicon. The body silicon layer is connected to the conductive film 12. The silicon pillar 80 is formed of the cover silicon layer and the body silicon layer. Then, the core member 79 is formed by depositing silicon oxide. The memory holes 95 are filled with the core member 79. Thus, the columnar members 70 are formed.

Then, the slits 97 are formed in the stacked body 60. The slits 97 spread along the XZ plane and pierce the stacked body 60 in the X-direction and the Z-direction.

Then, the sacrificial films 41 (referring to FIG. 36) are removed via the slits 97 by, for example, performing wet etching using hot phosphoric acid. At this time, the insulating films 21, the insulating member 69, and the columnar members 70 that are made of silicon oxide substantially are not removed; and the columnar members 70 support the insulating films 21. Thereby, spaces 99 are formed between the insulating films 21.

Then, the aluminum oxide layer 84 is formed on the inner surfaces of the spaces 99 by depositing aluminum oxide via the slits 97. The blocking insulating film 85 includes the silicon oxide layer 83 and the aluminum oxide layer 84. The memory film 86 is formed of the tunneling insulating film 81, the charge storage film 82, and the blocking insulating film 85.

Then, the barrier metal layer 89 is formed on the aluminum oxide layer 84 by depositing titanium nitride and titanium via the slits 97. Then, the main portion 88 is formed by depositing tungsten inside the spaces 99 via the slits 97 by, for example, CVD (Chemical Vapor Deposition). Then, the tungsten, the titanium, the titanium nitride, and the aluminum oxide are removed from inside the slits 97 by performing etching and are caused to remain only inside the spaces 99. Thereby, the electrode films 22 are formed inside the spaces 99. Thus, the sacrificial films 41 are replaced with the electrode films 22. Then, the insulating members 23 are formed inside the slits 97 by depositing silicon oxide.

Then, the plugs 73 are formed on the silicon pillars 80. Then, the bit lines 72 that extend in the Y-direction are formed and are connected to the plugs 73. Thus, the memory device 2 according to the embodiment is manufactured.

Effects of the embodiment will now be described.

According to the embodiment, the end portion 60a of the stacked body 60 in which the number of stacks is high can be patterned into a staircase configuration without forming an excessively thick resist pattern by multiply implementing the series of processing of forming a resist pattern, alternately repeating etching using the resist pattern as a mask and slimming of the resist pattern, and removing the resist pattern. Also, by setting the initial configuration of each resist pattern to be a configuration in which the side surfaces are curved to be concave, the increase of the error E as the slimming is performed is compensated by the decrease of the shape difference D; and high patterning precision of the steps S can be maintained. Therefore, the shape precision of the memory device 2 according to the embodiment is high.

According to the embodiments described above, a memory device having high shape precision and a method for manufacturing the memory device can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device, comprising:
a substrate; and
a stacked body, the substrate and the stacked body being arranged along a first direction, the stacked body including a plurality of electrode films, a configuration of an end portion in a second direction of the stacked body being a staircase configuration, the second direction being parallel to a major surface of the substrate, a plurality of steps corresponding to the plurality of electrode films being formed in the staircase configuration,
a first distance between a first step and an end edge of the stacked body in the second direction being shorter than a second distance between a second step and the end edge in the second direction,
the first step being a step of the plurality of steps positioned at an end portion in a third direction of the stacked body,
the second step being a step of the plurality of steps positioned at a central portion in the third direction of the stacked body,
the first step and the second step corresponding to two electrode films of the plurality of electrode films positioned at the same level when counting along the first direction from the substrate side, and
the third direction crossing the second direction and being parallel to the major surface.

2. The device according to claim 1, wherein
a third distance between a third step and the end edge of the stacked body in the second direction is shorter than a fourth distance between a fourth step and the end edge of the stacked body in the second direction,
in the third direction, a position of the third step is equal to a position of the first step,
in the third direction, a position of the fourth step is equal to a position of the second step, and
the third step and the fourth step correspond to two electrode films of the plurality of electrode films positioned at the same level when counting along the first direction from the substrate side, the same level being different from the first step and the second step.

3. The device according to claim 2, wherein
the third distance is longer than the first distance,
the fourth distance longer than the second distance, and
a difference between the third distance and the first distance is larger than a difference between the fourth distance and the second distance.

4. The device according to claim 1, further comprising:
a semiconductor member extending in the first direction and being provided inside the stacked body; and
a charge storage member provided between the semiconductor member and one of the plurality of electrode films.

5. The device according to claim 1, further comprising:
a first insulating film covering the end portion of the stacked body, the substrate and the first insulating film being arranged along the first direction; and
a plurality of contacts extending in the first direction, being provided inside the first insulating film, and being connected to the plurality of electrode films.

6. The device according to claim 5, wherein
a distance between the first step and a first contact is longer than a distance between the second step and a second contact,
the first contact is a contact of the plurality of contacts connected to the electrode corresponding to the first step, and
the second contact is a contact of the plurality of contacts connected to the electrode film corresponding to the second step.

7. The device according to claim 5, wherein the plurality of contacts are arranged in a matrix configuration along the second direction and the third direction, and the plurality of electrode films are arranged in a matrix configuration along the first direction and the third direction.

8. A memory device, comprising:
a substrate;
a stacked body, the substrate and the stacked body being arranged along a first direction, the stacked body including a plurality of electrode films, a configuration of an end portion in a second direction of the stacked body being a staircase configuration, the second direction being parallel to a major surface of the substrate, a plurality of terraces corresponding to the plurality of electrode films being formed in the staircase configuration; and
a plurality of contacts extending in the first direction and being connected to the plurality of terraces,
a distance between a first step and a first contact being longer than a distance between a second step and a second contact,
the first step being a step between a first terrace and a second terrace,
the second step being a step between a third terrace and a fourth terrace,
the first terrace and the second terrace being two terraces of the plurality of terraces adjacent to each other in the second direction and positioned at an end portion in a third direction of the stacked body, a distance between the first terrace and the substrate being longer than a distance between the second terrace and the substrate,
the third direction crossing the second direction and being parallel to the major surface,
the third terrace and the fourth terrace being two terraces of the plurality of terraces adjacent to each other in the second direction and positioned at a central portion in the third direction of the stacked body, a distance between the third terrace and the substrate being longer than a distance between the fourth terrace and the substrate,
the first contact being a contact of the plurality of contacts connected to the first terrace, and
the second contact being a contact of the plurality of contacts connected to the third terrace.

9. The device according to claim 8, wherein
a distance between the first terrace and the third terrace in the first direction is shorter than a distance between the first terrace and the second terrace in the first direction, and
a distance between the second terrace and the fourth terrace in the first direction is shorter than the distance between the first terrace and the second terrace in the first direction.

10. The device according to claim 9, wherein a length of the first terrace in the second direction is longer than a length of the third terrace in the second direction.

11. The device according to claim 8, further comprising a first insulating film covering the end portion of the stacked body, the substrate and the first insulating film being arranged along the first direction, the plurality of contacts being disposed inside the first insulating film.

12. The device according to claim 8, wherein the plurality of electrode films are arranged in a matrix configuration along the first direction and the third direction, and the plurality of contacts are arranged in a matrix configuration along the second direction and the third direction.

13. The device according to claim 8, further comprising:
a semiconductor member extending in the first direction and being provided inside the stacked body; and
a charge storage member provided between the semiconductor member and one of the plurality of electrode films.

14. A method for manufacturing a memory device, comprising:
forming a stacked body by forming a first film and a second film alternately above a substrate, a plurality of the first films and a plurality of the second films being stacked along a first direction;
forming a pattern on the stacked body, a side surface facing a second direction being concave when viewed from the first direction, the second direction being parallel to a major surface of the substrate;
slimming the pattern; and
selectively removing at least one of the first films and at least one of the second films by performing etching using, as a mask, the pattern after the slimming.

15. The method according to claim 14, wherein a configuration of the pattern before the slimming when viewed from the first direction is set to be a quadrilateral having four acute corners and four side surfaces.

16. The method according to claim 14, wherein
a length in the second direction of an end portion of the pattern in a third direction is longer than a length in the second direction of a central portion of the pattern in the third direction, and
the third direction crosses the second direction and is parallel to the major surface.

17. The method according to claim 14, wherein
the pattern contains a resist, and
the slimming includes ashing the pattern.

18. The method according to claim 14, wherein
the slimming of the pattern and the performing of the etching using, as the mask, the pattern after the slimming are multiply and alternately implemented.

19. The method according to claim 14, wherein
processing including the forming of the pattern, the slimming of the pattern, and the performing of the etching using, as the mask, the pattern after the slimming are multiply implemented.

20. The method according to claim 14, further comprising:
forming a hole in the stacked body;
forming a charge storage member on an inner surface of the hole;
forming a semiconductor member inside the hole;
forming a slit extending in the second direction in tie stacked body after the forming of the semiconductor member;
removing the second films via the slit; and
forming, via the slit, an electrode film inside a space where the second films are removed.

* * * * *